(12) United States Patent
Zhang et al.

(10) Patent No.: US 12,298,804 B2
(45) Date of Patent: May 13, 2025

(54) SYSTEM FOR DETECTING PROPER POSITIONING OF ACCESSORY

(71) Applicant: Honor Device Co., Ltd., Shenzhen (CN)

(72) Inventors: Wujia Zhang, Shenzhen (CN); Youjun Zhang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 18/264,909

(22) PCT Filed: Jan. 4, 2023

(86) PCT No.: PCT/CN2023/070462
§ 371 (c)(1),
(2) Date: Aug. 9, 2023

(87) PCT Pub. No.: WO2023/193496
PCT Pub. Date: Oct. 12, 2023

(65) Prior Publication Data
US 2025/0004499 A1 Jan. 2, 2025

(30) Foreign Application Priority Data
Apr. 6, 2022 (CN) .......................... 202210356243.3

(51) Int. Cl.
*G06F 1/16* (2006.01)
*G01R 33/07* (2006.01)
(Continued)

(52) U.S. Cl.
CPC ......... *G06F 1/1607* (2013.01); *G01R 33/072* (2013.01); *G06F 1/1626* (2013.01);
(Continued)

(58) Field of Classification Search
CPC ........ G06F 1/1607; G06F 1/16; G06F 1/1626; G06F 1/266; G06F 3/03545; G06F 2200/1632; G01R 33/072; H02J 50/90
See application file for complete search history.

(56) References Cited

U.S. PATENT DOCUMENTS

| 10,345,929 B2 | 7/2019 | Du |
| 2008/0106520 A1 | 5/2008 | Free et al. |

(Continued)

FOREIGN PATENT DOCUMENTS

| CN | 206178720 U | 5/2017 |
| CN | 109542254 A | 3/2019 |

(Continued)

*Primary Examiner* — Pegeman Karimi
(74) *Attorney, Agent, or Firm* — Conley Rose, P.C.

(57) ABSTRACT

A system for detecting proper positioning of an accessory, including an electronic device and an accessory. The electronic device includes a first attachment component, a magnetometer, and a processor. The accessory includes a second attachment component. The second attachment component is configured to be attached to the first attachment component, so that the accessory is fixed through attachment to the electronic device in a first orientation or a second orientation. The magnetometer is further configured to be triggered by a combined magnetic field of the first attachment component and the second attachment component to output the magnetic field intensity information when the accessory is fixed through attachment to the electronic device in the first orientation or the second orientation. The processor indicates whether the accessory is fixed in position based on the magnetic field intensity information.

20 Claims, 18 Drawing Sheets

(51) Int. Cl.
*G06F 1/26* (2006.01)
*G06F 3/0354* (2013.01)
*H02J 50/90* (2016.01)

(52) U.S. Cl.
CPC .......... *G06F 1/266* (2013.01); *G06F 3/03545* (2013.01); *H02J 50/90* (2016.02); *G06F 2200/1632* (2013.01)

(56) References Cited

U.S. PATENT DOCUMENTS

| | | |
|---|---|---|
| 2015/0102806 A1 | 4/2015 | Tsuchihashi et al. |
| 2016/0216783 A1* | 7/2016 | Nicholson .............. G06F 3/0383 |
| 2017/0371434 A1 | 12/2017 | Kobori |
| 2018/0032163 A1 | 2/2018 | Park et al. |
| 2019/0123588 A1* | 4/2019 | Kim ........................ H04B 5/26 |
| 2019/0180898 A1 | 6/2019 | Lauder et al. |
| 2019/0356167 A1* | 11/2019 | Smith ...................... H02J 50/12 |
| 2021/0099029 A1 | 4/2021 | Oro et al. |
| 2021/0269093 A1 | 9/2021 | Kato et al. |
| 2022/0077724 A1* | 3/2022 | Patel ....................... H02J 50/60 |
| 2023/0179019 A1 | 6/2023 | Wu et al. |

FOREIGN PATENT DOCUMENTS

| | | |
|---|---|---|
| CN | 111459306 A | 7/2020 |
| CN | 113324564 A | 8/2021 |
| CN | 113922513 A | 1/2022 |
| CN | 114217699 A | 3/2022 |
| EP | 2813918 A1 | 12/2014 |
| WO | 2021194132 A1 | 9/2021 |

\* cited by examiner

SYSTEM FOR DETECTING PROPER POSITIONING OF ACCESSORY

CROSS-REFERENCE TO RELATED APPLICATIONS

This is a U.S. National Stage of International Application No. PCT/CN2023/070462 filed on Jan. 4, 2023, which claims priority to Chinese Patent Application No. 202210356243.3, filed with China National Intellectual Property Administration on Apr. 6, 2022, both of which are incorporated herein by reference in their entireties.

TECHNICAL FIELD

This application relates to the technical field of attachment detection, and in particular, to a system for detecting proper positioning of an accessory.

BACKGROUND

In response to the pursuit of performance of an electronic device and high user experience of the market, more and more electronic devices are equipped with to-be-attached accessories. The to-be-attached accessory (such as a stylus) may be fixed to the electronic device (such as a tablet computer) by attachment, or may exist independently from the electronic device.

The electronic device usually has a function to detect whether the to-be-attached accessory is fixed in place, so that some functions can be performed based on the above, such as a function of charging the stylus on the tablet computer. However, the detection principle of current attachment detection solutions leads to the problem of high cost of consumables.

SUMMARY

Embodiments of this application provide a system for detecting proper positioning of an accessory, a to-be-attached accessory, and an electronic device, to resolve a problem that a detection principle of an existing attachment detection solution has high consumable costs.

To achieve the foregoing objectives, embodiments of this application use the following technical solutions:

A system for detecting proper positioning of an accessory, including: an electronic device, including a first attachment component, a magnetometer, and a processor, where the magnetometer is configured to obtain and output magnetic field intensity information of a position of the magnetometer; and a to-be-attached accessory, including a second attachment component, where the second attachment component is configured to be attached to the first attachment component, so that the to-be-attached accessory is fixed through attachment to the electronic device in a first orientation or a second orientation. The magnetometer is further configured to be triggered by a combined magnetic field of the first attachment component and the second attachment component to output first magnetic field intensity information when the to-be-attached accessory is fixed through attachment to the electronic device in the first orientation or the second orientation. The processor is connected to the magnetometer, and is configured to receive the magnetic field intensity information, and output first indication information when receiving the first magnetic field intensity information, where the first indication information is used for indicating that the to-be-attached accessory is fixed in position through attachment.

It should be understood that the to-be-attached accessory changes from a state of not being fixed in position through attachment to a state of being fixed in position through attachment, and the second attachment component and the first attachment component generate two magnetic fields of different magnitudes at the position where the magnetometer is located. On this basis, in the system for detecting proper positioning of an accessory provided in this embodiment, the magnetic field intensity information of the position is obtained by the magnetometer, and the strength of the magnetic field intensity information detected by the magnetometer is distinguished by the processor, so as to determine whether the to-be-attached accessory is fixed through attachment to the electronic device. It can be seen that this embodiment can accurately determine whether the to-be-attached accessory is fixed in position through attachment.

In this embodiment, the to-be-attached accessory may be fixed through attachment to the electronic device in the first orientation or the second orientation. In order to detecting an attachment situation of the two orientations, in this embodiment, the second attachment component and the first attachment component can trigger the magnetometer to output the first magnetic field intensity information capable of causing the processor to output the first indication information when the to-be-attached accessory is fixed through attachment to the electronic device in two orientations, so as to realize the detection when the two orientations are fixed in position through attachment.

It can be seen that by arranging a magnetometer in the electronic device and using the existing second attachment component in the to-be-attached accessory and the existing first attachment component in the electronic device, the detection of the attachment component when attachment is fixed in position through attachment in the first orientation or the second orientation is achieved. Compared with the detection solution that two Hall devices are arranged in the electronic device and one magnet is arranged in the to-be-attached accessory to realize that the to-be-attached accessory is fixed in position through attachment in a positive direction or in a negative direction, one magnetometer is added, but the expense of one magnet and two Hall devices is saved, and the cost of consumables is greatly reduced. In addition, the Hall device requires that a magnetic force line of the magnet in the to-be-attached accessory extends through a Hall plate of the Hall device vertically, so the Hall device needs to be upright and fixed to cause the Hall plate perpendicular to a main board. In this case, the Hall device is connected to the main board through the device such as an elastic piece. Therefore, in this embodiment, since the magnetometer does not need the magnetic force line to pass through, there is no need for an auxiliary device to transfer, so the cost of consumables for these auxiliary devices is saved.

In some embodiments, the magnetic field intensity information outputted by the magnetometer when triggered by the magnetic field of the first attachment component is second magnetic field intensity information. The processor is configured to: output the first indication information when the magnetic field intensity information is greater than a first preset threshold, and output second indication information when the magnetic field intensity information is less than the first preset threshold, where the second indication information is used for indicating that the to-be-attached accessory is not fixed in position through attachment. The first preset threshold is obtained based on the second magnetic field intensity information.

It should be understood that if the magnetic fields of the first attachment component and the second attachment component are synthetically superimposed during the fixation through attachment, the magnetic field intensity generated by a complex of the first attachment component and the second attachment component at the magnetometer is greater than the magnetic field intensity generated at the magnetometer by a single first attachment component. Therefore, the first magnetic field intensity information is greater than the second magnetic field intensity information. On this basis, when the to-be-attached accessory is fixed through attachment to the electronic device in the first orientation or the second orientation, the first attachment component and the second attachment component cause the magnetometer to output the first magnetic field intensity information greater than the second magnetic field intensity information. The processor receives the first magnetic field intensity information greater than the second magnetic field intensity information. Since the first preset threshold is obtained by the second magnetic field intensity information, the first magnetic field intensity information is greater than the first preset threshold, so that the processor outputs the first indication information to prompt the to-be-attached accessory to be fixed in position through attachment.

It can be seen that in this embodiment, when the first preset threshold is obtained based on the second magnetic field intensity information, it can be ensured that the magnetometer outputs the first magnetic field intensity information greater than the first preset threshold when the attachment component is fixed through attachment, thereby realizing the detection that the to-be-attached accessory is fixed in position through attachment.

In some other embodiments, the magnetic field intensity information outputted by the magnetometer when the to-be-attached accessory is misattached to the electronic device is third magnetic field intensity information. The processor is configured to: output the first indication information when the magnetic field intensity information is greater than a second preset threshold, and output second indication information when the magnetic field intensity information is less than the second preset threshold, where the second indication information is used for indicating that the to-be-attached accessory is not fixed in position through attachment. The second preset threshold is determined based on the third magnetic field intensity information outputted by the magnetometer when the to-be-attached accessory is exactly misattached to the electronic device.

It should be noted that the second attachment component is offset from the first attachment component by a smaller spacing when the to-be-attached accessory is fixed through attachment to the electronic device and the distance from the magnetometer is closer, as compared to the misattached state. In this case, the first magnetic field intensity information generated by the second attachment component and the first attachment component at the magnetometer is greater than the third magnetic field intensity information. On this basis, when the to-be-attached accessory is fixed through attachment to the electronic device, the processor receives the first magnetic field intensity information that is greater than the second preset threshold, thereby outputting the first indication information to indicate that to-be-attached accessory is fixed in position through attachment.

Moreover, the second attachment component is offset from the first attachment component by a larger spacing when the to-be-attached accessory is in the unattached state and the distance from the magnetometer is further, as compared to the misattached state. In this case, the fourth magnetic field intensity information generated by the second attachment component and the first attachment component at the magnetometer is less than the third magnetic field intensity information. On this basis, when the to-be-attached accessory is not attached to the electronic device, the processor receives the fourth magnetic field intensity information that is less than the second preset threshold, thereby outputting the second indication information to indicate that to-be-attached accessory is not fixed in position through attachment. In this case, the to-be-attached accessory is not attached. On this basis, the second indication information is not only used for indicating that the to-be-attached accessory is not fixed in position through attachment, further, the second indication information can also be used for indicating that the stylus is not attached, that is, in the unattached state.

It can be seen that in this embodiment, when the second preset threshold is obtained based on the third magnetic field intensity information when the to-be-attached accessory is exactly misattached, it can be ensured that the magnetometer outputs the first magnetic field intensity information greater than the second preset threshold when the attachment component is fixed through attachment, thereby realizing the detection that the to-be-attached accessory is fixed in position through attachment: and it can also ensure that the magnetometer outputs the fourth magnetic field intensity information less than the second preset threshold when the attachment component is not attached, so as to realize the detection that the to-be-attached accessory is not fixed in position through attachment.

In some other embodiments, the processor is configured to: output the first indication information when the magnetic field intensity information is greater than a third preset threshold, and output second indication information when the magnetic field intensity information is less than the third preset threshold, where the second indication information is used for indicating that the to-be-attached accessory is not fixed in position through attachment. The third preset threshold is determined based on the first magnetic field intensity information outputted by the magnetometer when the to-be-attached accessory is exactly fixed through attachment to the electronic device.

It should be noted that the second attachment component is offset from the first attachment component by a smaller spacing when the to-be-attached accessory is fixed through attachment to the electronic device and the distance from the magnetometer is closer, as compared to the state of being fixed in position through attachment. In this case, the first magnetic field intensity information generated by the second attachment component and the first attachment component at the magnetometer is greater than the first magnetic field intensity information when being exactly fixed through attachment. On this basis, when the to-be-attached accessory is fixed through attachment to the electronic device, the processor receives the first magnetic field intensity information that is greater than the third preset threshold, thereby outputting the first indication information to indicate that to-be-attached accessory is fixed in position through attachment.

Moreover, the second attachment component is offset from the first attachment component by a larger spacing when the to-be-attached accessory is in the unattached state and the misattached state, and the distance from the magnetometer is further, as compared to the state of exactly fixed through attachment. In this case, the third magnetic field intensity information and the fourth magnetic field intensity information generated by the second attachment component and the first attachment component at the magnetometer are than the first magnetic field intensity information as being fixed in position through attachment. On this basis, when the to-be-attached accessory is misattached to the electronic device or is not attached to the electronic device, the processor receives the third magnetic field intensity information and the fourth magnetic field intensity information less than the third preset threshold, thereby outputting the second indication information to indicate that the to-be-attached accessory is not fixed in position through attachment.

It can be seen that in this embodiment, when the third preset threshold is obtained based on the first magnetic field intensity information when the to-be-attached accessory is just fixed through attachment, it can be ensured that the magnetometer outputs the first magnetic field intensity information greater than the second preset threshold when the attachment component is fixed through attachment, thereby realizing the detection that the to-be-attached accessory is fixed in position through attachment: and it can also ensure that the magnetometer output the third magnetic field intensity information and the fourth magnetic field intensity information less than the third preset threshold when the attachment component is misattached or is not attached, so as to realize the detection that the to-be-attached accessory is not fixed in position through attachment.

Further, the magnetic field intensity information outputted by the magnetometer when the to-be-attached accessory is misattached to the electronic device is third magnetic field intensity information. When the magnetic field intensity information is less than the third preset threshold and greater than a second preset threshold, the second indication information is further used for indicating that the to-be-attached accessory is misattached. When the magnetic field intensity information is less than the second preset threshold, the second indication information is further used for indicating that the to-be-attached accessory is not attached. The second preset threshold is determined based on the third magnetic field intensity information outputted by the magnetometer when the to-be-attached accessory is exactly misattached to the electronic device.

The second attachment component is offset from the first attachment component by a smaller spacing when the to-be-attached accessory is in the unattached state and the distance from the magnetometer is closer, as compared to the exactly misattached state, In this case, the third magnetic field intensity information generated by the second attachment component and the first attachment component at the magnetometer is greater than the third magnetic field intensity information as being exactly misattached. On this basis, when the to-be-attached accessory is misattached to the electronic device, the processor receives the third magnetic field intensity information that is less than the third preset threshold but greater than the second preset threshold. In this case, the output of the second indication information is not only used for indicating that the to-be-attached accessory is not fixed in position through attachment, but also used for indicating that the to-be-attached accessory is misattached.

The second attachment component is offset from the first attachment component by a larger spacing when the to-be-attached accessory is in the unattached state and the distance from the magnetometer is further, as compared to the exactly misattached state. In this case, the second magnetic field intensity information generated by the second attachment component and the first attachment component at the magnetometer is less than the third magnetic field intensity information as being exactly misattached. On this basis, when the to-be-attached accessory is not attached to the electronic device, the processor receives the second magnetic field intensity information that is less than the second preset threshold. In this case, the output of the second indication information is not only used for indicating that the to-be-attached accessory is not fixed in position through attachment, but also used for indicating that the to-be-attached accessory is not attached.

It can be seen that in this embodiment, when the third preset threshold is obtained based on the first magnetic field intensity information when the to-be-attached accessory is exactly fixed through attachment, it can be ensured that the magnetometer outputs the third magnetic field intensity information and the fourth magnetic field intensity information less than the third preset threshold when the attachment component is misattached or not attached. Therefore, based on detecting that the to-be-attached accessory is not fixed in position through attachment, the third magnetic field intensity information and the fourth magnetic field intensity information can be further distinguished by the second preset threshold. Further, it is possible to distinguish whether the to-be-attached accessory is in the misattached state or the unattached state, so as to prompt the user to purposefully adjust the position of the to-be-attached accessory.

Optionally, the first attachment component includes a first attachment member and a second attachment member arranged symmetrically and spaced apart. The second attachment component includes a third attachment member and a fourth attachment member arranged symmetrically and spaced apart. When the first attachment member is attached to the third attachment member and the second attachment member is attached to the fourth attachment member, the to-be-attached accessory is fixed through attachment to the electronic device in the first orientation. When the first attachment member is attached to the fourth attachment member and the second attachment member is attached to the third attachment member, the to-be-attached accessory is fixed through attachment to the electronic device in the second orientation.

This embodiment provides a feasible solution for fixing the to-be-attached accessory on the electronic device in positive and negative orientations by attachment between the first attachment component and the second attachment component.

On this basis, optionally, the magnetometer is further configured to be triggered by a combined magnetic field of the first attachment member and the third attachment member to output the first magnetic field intensity information when the to-be-attached accessory is fixed through attachment to the electronic device in the first orientation; and is configured to be triggered by a combined magnetic field of the first attachment member and the fourth attachment member to output the first magnetic field intensity information when the to-be-attached accessory is fixed through attachment to the electronic device in the second orientation.

In some designs, the first attachment member and the second attachment member are arranged symmetrically and spaced apart in the first direction, and the first direction is perpendicular to a thickness direction of the electronic device. The third attachment member and the fourth attachment member are arranged symmetrically and spaced apart in the second direction, and the first orientation is opposite to the second orientation. In this embodiment, the first attachment member and the second attachment member are arranged spaced apart in the first direction, and the third attachment member and the fourth attachment member are arranged symmetrically and spaced apart in the second direction, therefore, the positive and negative attachment can be achieved with a difference of 180°.

In some embodiments of this application, the magnetometer and the first attachment member are arranged spaced apart in a third direction, and the third direction is perpendicular to the first direction and the thickness direction of the electronic device.

It should be understood that the magnetic field generated by the first attachment component at the magnetometer is weak if the magnetometer is far away from the electronic device; and the magnetic field generated at the magnetometer is also weak when the second attachment component is fixed through attachment to the electronic device by the stylus, That is to say, the magnetic field intensity measured by the magnetometer when the stylus is fixed through attachment, and the magnetic field intensity measured when the stylus is not fixed through attachment are very weak, and the difference is small. In this case, in order to distinguish different attachment states based on the magnetic field intensity, in the process of the stylus constantly approaching the electronic device, the magnetometer needs to be able to finely detect the magnetic field intensity at each moment, which requires weak sensitivity of the magnetometer. In this embodiment, the magnetometer may be arranged side by side with the first attachment member in the third direction. In this way, when the stylus is fixed through attachment to the electronic device, the second attachment component can generate a strong magnetic field at the magnetometer, reducing a sensitivity requirement for the magnetometer.

In some embodiments of this application, the electronic device further includes a first wireless charging module, and the first wireless charging module includes a first charging chip and a first charging structure. The to-be-attached accessory further includes a second wireless charging module, the second wireless charging module includes a second charging chip and a second charging structure, and the first charging structure and the second charging structure are opposite when the to-be-attached accessory is fixed through attachment in the first orientation or the second orientation. The first charging chip is configured to control the first charging structure to output a current when the to-be-attached accessory is fixed in position through attachment, and the second charging chip is configured to receive the current through the second charging structure to charge the to-be-attached accessory when the to-be-attached accessory is fixed in position through attachment.

Specifically, the first charging structure is symmetrically arranged with respect to a center line of the first attachment component. The second charging structure is symmetrically arranged with respect to a center line of the second attachment component. When the to-be-attached accessory is fixed through attachment to the electronic device, a spacing by which the first attachment component is offset from the second attachment component in the second direction is less than half of the first charging structure in the first direction and less than half of the second charging structure in the second direction.

It should be understood that in a case that the second charging structure is arranged at the center line of the second attachment component and the first charging structure is arranged at the center line of the first attachment component, whether the second charging structure and the first charging structure are opposite when the to-be-attached accessory is fixed through attachment in the positive direction or in the negative direction depends on the maximum spacing at which the first attachment component and the second attachment component are staggered. In this embodiment, the maximum spacing is less than half of the first charging structure in the first direction, and less than half of the second charging structure in the second direction. On this basis, the second charging structure located at the center line of the second attachment component is opposed to the first charging structure located at the center line of the first attachment component, so that the charging function can be realized by interaction. It can be seen that the embodiment provides a solution that enables the first charging structure and the second charging structure to remain opposite when the stylus is fixed though attachment in the first orientation or the second orientation.

Optionally, the first charging chip is further configured to control the first charging structure to output a communication connection request signal before the processor determines that the to-be-attached accessory is fixed in position through attachment or the to-be-attached accessory is not fixed in position through attachment, and the communication connection request signal is used for enabling the to-be-attached accessory to output pairing information. The first charging chip is further configured to receive the pairing information through the first charging structure, where when the first charging structure receives the pairing information and the pairing information is successfully verified, the to-be-attached accessory is fixed in position through attachment, and when the first charging structure does not receive the pairing information, the to-be-attached accessory is not fixed in position through attachment. The second charging chip is further configured to receive the communication connection request signal through the second charging structure, and control the second charging structure to output the pairing information after receiving the communication connection request signal.

In some embodiments, the first wireless charging module is further configured to switch to an operating state when the electronic device receives the first indication information, the first wireless charging module is further configured to switch to a low power consumption state when the electronic device does not receive the first indication information.

The first wireless charging module needs to be triggered by the first indication information (that is, the software interrupt) before operating. On this basis, in order to reduce power consumption, in some embodiments, the first wireless charging module is configured to: switch to the operating state when the processor outputs the software interrupt; and to the low power consumption state when the processor does not output the software interrupt. The operating state here refers to a state in which the first wireless charging module is powered on and the components can operate normally. In the operating state, the first wireless charging module can verify the pairing information, determine the attachment situation of the to-be-attached accessory, and the operation of charging. The low power consumption state here may refer to a state where the first wireless charging module is powered on, but the components are dormant. In the operating state, the low power consumption of each component of the first wireless charging module is very low.

For example, the to-be-attached accessory is a stylus, the to-be-attached accessory is attached to a side edge or a back side of the electronic device in the first orientation or the second orientation, and the second direction is a length direction of the to-be-attached accessory.

DESCRIPTION OF EMBODIMENTS

Technical solutions in embodiments of this application are described below with reference to the accompanying drawings in embodiments of this application. In description of this application, unless otherwise specified, "/" means an "or" relationship between associated objects, for example, A/B may mean A or B: and "and/or" in this application describes only an association relationship for describing associated objects and represents that three relationships may exist. For example, A/B may represent the following three cases: Only A exists, both A and B exist, and only B exists, where A and B may be singular or plural. In addition, in the descriptions of this application, "a plurality of" means two or more than two unless otherwise specified. Besides, to clearly describe the technical solutions in embodiments of this application, in embodiments of this application, terms such as "first" and "second" are used to distinguish same items or similar items whose functions and effects are basically the same. A person skilled in the art may understand that the terms such as "first" and "second" do not limit a quantity or an execution order, and the words such as "first" and "second" do not necessarily indicate a difference. Moreover, in embodiments of this application, terms such as "illustrative" and "for example" are used for presenting an example, an instance, or an illustration. Any embodiment or design solution described as an "exemplary" or "for example" in embodiments of this application should not be explained as being more preferred or having more advantages than other embodiments or design solutions. To be precise, the terms such as "illustrative" and "for example" are intended to present a related concept in a specific manner to facilitate understanding.

Embodiments of this application are described in detail below with reference to the accompanying drawings.

Figure 1:
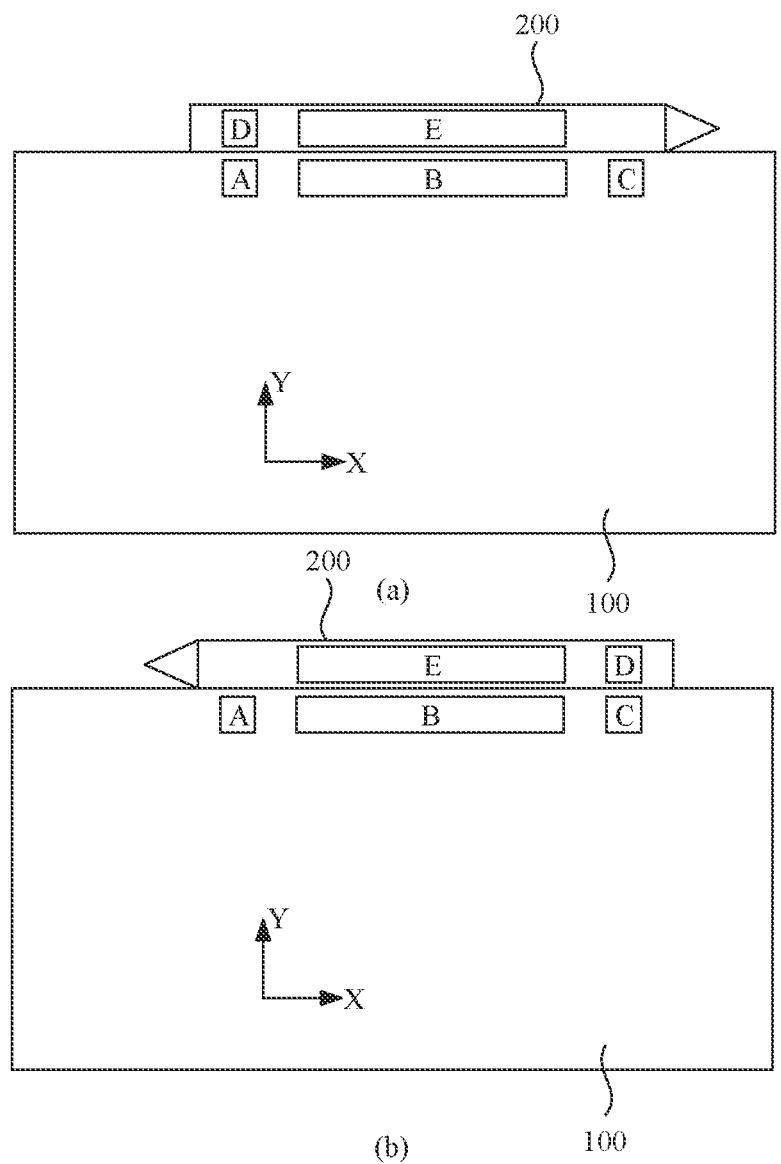
FIG. 1 is a schematic diagram of a principle of a possible attachment detection solution.

Referring to FIG. 1, FIG. 1 is a schematic diagram of a principle of a possible attachment detection solution. For ease of understanding, FIG. 1 is illustrated through an example that an electronic device 100 is used as a tablet computer 100, a to-be-attached accessory 200 is used as a stylus 200, and the stylus 200 is fixed through attachment to a side edge of the tablet computer 100. It should be understood that the side edge here refers to an area perpendicular to a back cover of the tablet computer 100 and extending along a thickness direction of the tablet computer 100. For the tablet computer 100 with a rectangular board surface, the tablet computer usually has four side edges, and the side edge for attaching the stylus 200 can be any one of these four side edges. In order to facilitate distinction and description, the side edge where the tablet computer 100 is configured to attach the stylus 200 is subsequently referred to as an attachment side edge.

In the tablet computer 100, a Hall device A, an attachment magnet B, and a Hall device C are arranged in sequence along a direction of X axis. A detection magnet D and an attachment magnet E are arranged in sequence in the stylus 200 along the direction of X axis. The stylus 200 is attached by the attachment magnet B and the attachment magnet E, so that the stylus can be fixed through attachment to a side edge of the tablet computer 100 in a positive direction as shown in (a) in FIG. 1 (that is, a positive direction of a pen point of the stylus 200 towards the X axis), or can be fixed through attachment to a side edge of the tablet computer in a reverse positive direction as shown in (b) in FIG. 1 (that is, a negative direction of the pen point of the stylus 200). It should be understood that the direction of the X axis in the figure is a length direction of the stylus 200 and a length direction of the attachment side edge. A direction of the Y axis is perpendicular to the direction of the X axis.

As shown in (a) in FIG. 1, when the stylus 200 is fixed through attachment to the side edge of the tablet computer 100 in the positive direction, the detection magnet D exactly faces the Hall device A, and a strong magnetic field is generated at the Hall device A, thereby triggering the Hall device A to interrupt to report the proper attachment of the stylus 200. As shown in (b) in FIG. 1, when the stylus 200 is fixed through attachment to the side edge of the tablet computer 100 in the negative direction, the detection magnet D exactly faces the Hall device C, and the strong magnetic field is generated at the Hall device C, thereby triggering the Hall device C to interrupt and report the attachment in place with the stylus 200. The tablet computer 100 can start charging the stylus 200 through a wireless charging coil based on the interrupt.

It can be seen that in the attachment detection solution shown in FIG. 1, the detection of the stylus 200 when the stylus is fixed in position through attachment in a positive direction or in a negative direction is realized by arranging two Hall devices, which are the Hall device A and the Hall device C, and one detection magnet D in the tablet computer 100. However, in this embodiment, the arrangement of the two Hall devices obviously increases cost of the tablet computer, and the tablet computer also needs to be arranged with the above two hall devices related to a flexible printed circuit (flexible printed circuit, FPC), an elastic piece, and another connection line, which occupy more layout space in the tablet computer. In addition, the arrangement of the detection magnet D also occupies more layout space within the stylus 200, and leads to an increase in the cost of the stylus 200.

Figure 2:
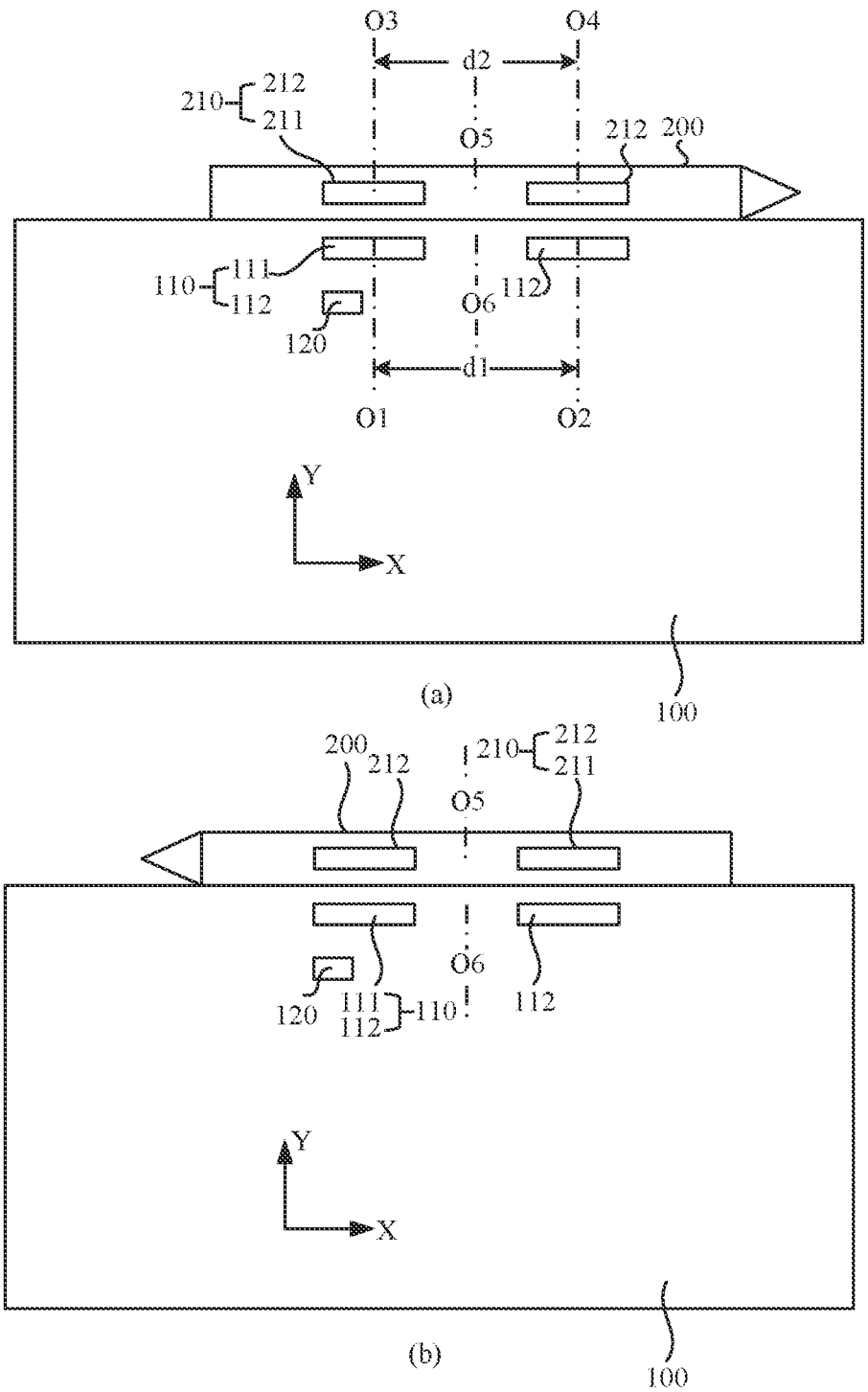
FIG. 2 is a schematic structural diagram of a system for detecting proper positioning of an accessory according to some embodiments of this application.

FIG. 2 may be referred to resolve the above technical problems. FIG. 2 is a schematic structural diagram of a system for detecting proper positioning of an accessory according to some embodiments of this application. (a) in FIG. 2 illustrates a state in which the stylus 200 is fixed through attachment to the attachment side edge of the tablet computer 100 in the positive direction, and (b) in FIG. 2 illustrates a state in which the stylus 200 is fixed through attachment to the attachment side edge of the tablet computer 100 in the negative direction. This embodiment further improves the system for detecting proper positioning of an accessory in terms of saving the cost of the tablet computer 100 and the stylus 200 and simplifying internal structural layouts of the tablet computer and the stylus.

The system for detecting proper positioning of an accessory includes an electronic device 100 and a to-be-attached accessory 200. For ease of understanding, embodiments of this application are illustrated through an example that the electronic device 100 is used as the tablet computer 100, the to-be-attached accessory 200 is used as the stylus 200, and the stylus 200 is attached to the attachment side edge of the tablet computer 100. It should be noted that, it should be understood that in other embodiments, the stylus 200 can also be attached on a back side of the tablet computer 100, which can be implemented with reference to FIG. 2. Details are not repeated in embodiments of this application. In addition, for ease of description, a coordinate system is established in FIG. 2, and specific definitions of the X and Y axes may be referred to relevant descriptions in the embodiment shown in FIG. 1.

As can be seen by FIG. 2, the tablet computer 100 includes a first attachment component 110 that can generate a magnetic field, and a magnetometer 120. The magnetometer 120 and the first attachment component 110 are spaced side by side along a first direction. The first direction is the length direction of the attachment side edge of tablet computer 100, that is, the direction of the X axis in the illustrated state. This direction is perpendicular to the thickness direction of the tablet computer 100 (the thickness direction of the tablet computer 100 is a direction perpendicular to a paper).

It can also be seen from FIG. 2 that the stylus 200 includes a second attachment component 210 that can generate the magnetic field. The second attachment component 210 extends along a second direction, that is, the length direction of the second attachment component 210 is the second direction. The second direction is the length direction of the stylus 200 and the direction of the X axis in the illustrated state.

The second attachment component 210 is attached with the first attachment component 110, so that the stylus 200 is fixed through attachment to the attachment side edge of the tablet computer 100 in the first orientation shown in (a) in FIG. 2 or the second orientation shown in (b) in FIG. 2. It should be understood that orientation refers to a direction pointed by a tip of the stylus 200. The first orientation here is the positive direction of the pen point of the stylus 200 towards the X axis of the figure, that is, the above positive direction: and the second orientation means that the pen point of the stylus 200 points in the negative direction of the X axis shown in the figure, that is, refers to the above negative direction. The first orientation is opposite to the second orientation, that is, a difference of 180°. For ease of understanding, the first orientation is subsequently abbreviated as positive direction and the second orientation as negative direction.

Figure 3:
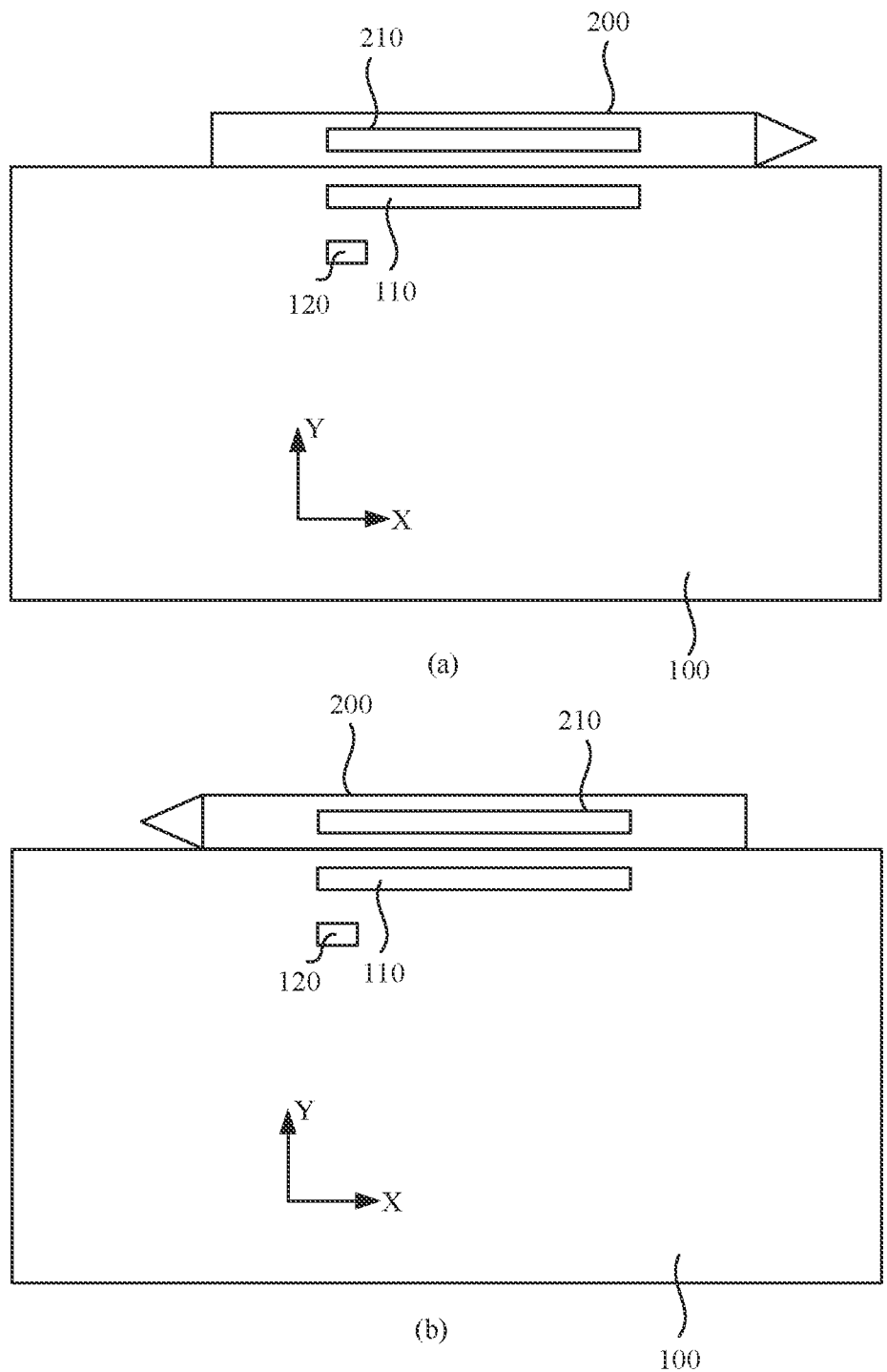
FIG. 3 is another schematic structural diagram of a system for detecting proper positioning of an accessory according to some embodiments of this application.

Still referring to FIG. 2, in some embodiments, the first attachment component 110 includes a first attachment member 111 and a second attachment member 112 arranged symmetrically along the first direction, so that the stylus 200 can be fixed to the tablet computer 100 in both the positive and negative orientations. The second attachment component 210 includes a third attachment member 211 and a fourth attachment member 212 arranged symmetrically along the second direction. In this way, as shown in (a) in FIG. 2, the stylus 200 is positively fixed through attachment to the attachment side edge of the tablet computer 100 when the first attachment member 111 and the third attachment member 211 are attached relative to each other and the second attachment member 112 and the fourth attachment member 212 are attached relative to each other; and as shown in (b) in FIG. 2, the stylus 200 is fixed through attachment to the attachment side edge of the tablet computer 100 in the negative direction when the first attachment member 111 and the fourth attachment member 212 are attached and the second attachment member 112 and the third attachment member 211 are attached relative to each other. Opposite in this application means that two opposing components partially or fully overlap in the direction of the Y axis: and non-opposing in the embodiment of this application means that there is no overlapping area between the two non-opposing components in the direction of the Y axis. In other embodiments, in order to cause the stylus 200 can be fixed on the attachment side edge of the tablet computer 100 in both positive and negative directions, the first attachment component 110 and the second attachment component 210 may also be a monomer structure shown in (a) or (b) in FIG. 3, which is not specifically limited in the embodiment of this application.

In an embodiment, the first attachment member 111 and the second attachment member 112 are single magnets. Specifically, the first attachment member 111 includes, but is not limited to, a magnet or a magnetic steel. The second attachment member 112 includes, but is not limited to, a magnet or a magnetic steel. A shape of the first attachment member 111 includes, but is not limited to, a cubic shape and a cylindrical shape. A shape of the second attachment member 112 includes, but is not limited to, a cubic shape and a cylindrical shape. Optionally, the first attachment member 111 and the second attachment member 112 have the same specifications. That is to say, the first attachment member 111 and the second attachment member 112 have the same shape, size, and the like. In this way, during the processing of the electronic device, one type of magnet can be selected to be used as the first attachment member 111 and the second attachment member 112 respectively, and there is no need to select two different magnets to be used as the first attachment member 111 and the second attachment member 112, which can simplify the processing process. Similarly, the third attachment member 211 and the fourth attachment member 212 can also refer to the embodiment, and details are not described herein.

In some embodiments, a spacing by which the first attachment member 111 is offset from the second attachment member 112 is a first spacing d1, a spacing by which the third attachment member 211 is offset from the fourth attachment member 212 is a second spacing d2, and the first spacing d1 is equal to the second spacing d2. In this way, when the stylus 200 is positively fixed to the tablet computer through attachment, it can ensure that the first attachment member 111 is attached relative to the third attachment member 211, and the second attachment member 112 is attached relative to the fourth attachment member 212. When the stylus 200 is fixed through attachment to the tablet computer in the negative direction, it can ensure that the first attachment member 111 is attached relative to the fourth attachment member 212, and the second attachment member 112 is attached relative to the third attachment member 211. It should be noted that the "first spacing" in this application refers to a distance between a center line O1 of the first attachment member 111 and a center line O2 of the second attachment member 112. The "second spacing" in this application refers to a distance between a center line O3 of the third attachment member 211 and a center line O4 of the fourth attachment member 212. It should be noted that the "center line" in this application means a center line extending along the direction of the Y axis.

The meaning of the stylus 200 being fixed through attachment to the attachment side edge of the tablet computer 100 is described below.

Figure 4:
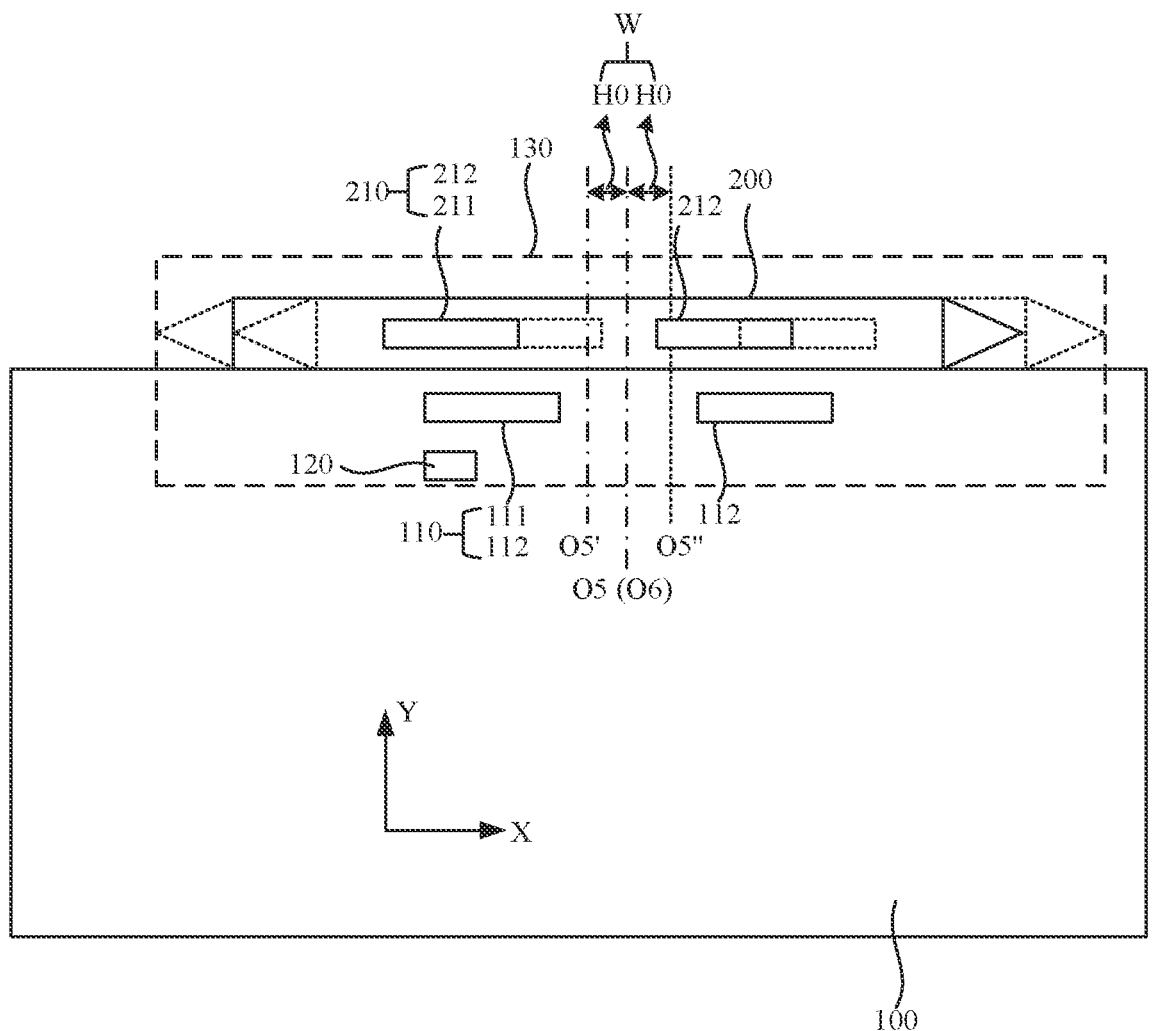
FIG. 4 is a schematic diagram of a fixable area of a tablet computer shown in FIG. 2.

Referring to FIG. 4, FIG. 4 shows a schematic diagram of a fixable area of a tablet computer shown in FIG. 2. O5, O5', and O5" are center lines of the second attachment component 210. O6 is a center line of the first attachment component 110. O5 is the position at which the center line of the second attachment component 210 is located when the second attachment component 210 is not staggered with respect to the first attachment component 110. In this case, O5 and O6 are on the same line. O5' is the position at which the center line of the second attachment component 210 is located when the second attachment component 210 is staggered H0 in the negative direction of the X axis with respect to the first attachment component 110. In this case, a spacing between O5' and O5 (or O6) is H0. O5" is the position at which the center line of the second attachment component 210 is located when the second attachment component 210 is staggered H0 with respect to the first attachment component 110 in the positive direction of the X axis. In this case, a spacing between O5" and O5 (or O6) is H0.

It should be noted that staggered in the embodiment of this application means that there is a spacing between the center lines of two bodies that are staggered from each other. Non-staggered in the embodiment of this application means that there is a spacing between the center lines of two bodies that are not staggered from each other.

The tablet computer 100 typically has a fixable area 130 for the stylus 200 to be fixed through attachment. The fixable area 130 is an area on the tablet computer 100 that can be fixed through attachment by the stylus 200, and the stylus 200 can be moved to an arbitrary position in the area for fixing in position through attachment. However, once the stylus 200 exceeds the fixable area 130, the stylus 200 is no longer be fixed through attachment. Based on the above, that the stylus 200 is fixed through attachment to the attachment side edge of the tablet computer 100 refers to a case that the stylus 200 is fixed to any position in the fixable area 130 through attachment.

It should be noted that when the second attachment component 210 moves in the positive direction of the X axis relative to the first attachment component 110, the stylus 200 moves in the positive direction of the X axis: and when the second attachment component 210 moves in the negative direction of the X axis relative to the first attachment component 110, the stylus 200 moves in the negative direction of the X axis. Therefore, a movable width W of the stylus 200 within the fixable area 130 (the movable width W is illustrated in the figure with the spacing of O5' and O5") depends on a maximum spacing H0 that can be staggered when the second attachment component 210 and the first attachment component 110 perform attachment side edge and fixation. The second attachment component 210 can be staggered by the maximum spacing H0 in the positive direction of the X axis with respect to the first attachment component 110 (illustrated by H0 on a right side in the figure), and can also be staggered by the maximum spacing H0 in the negative direction of the X axis with respect to the first attachment component 110 (illustrated by H0 on a left side in the figure), therefore, W=2H0.

It should be understood that the maximum spacing H0 when the second attachment component 210 and the first attachment component 110 are fixed through attachment is a maximum spacing that can be allowed to be offset, so that the second attachment component 210 and the first attachment component 110 are attached together without falling off. This means that when the second attachment component 210 and the first attachment component 110 are staggered by a spacing less than or equal to H0 (including two cases of being offset in the positive direction of the X axis and being staggered in the negative direction of the X axis), the second attachment component 210 and the first attachment component 110 are attached together. In this case, the stylus 200 is fixed through attachment to the tablet computer 100. When the second attachment component 210 is offset from the first attachment component 110 by a spacing greater than H0 (including two cases of being offset in the positive direction of the X axis and being staggered in the negative direction of the X axis), the second attachment component 210 and the first attachment component 110 are no longer be attached. In this case, the stylus 200 is no longer fixed through attachment to the tablet computer 100. As can be seen, the maximum spacing H0 that can be offset between the second attachment component 210 and the first attachment component 110 for attachment is the spacing that the first attachment component 110 is offset from the second attachment component 210 when the stylus 200 is exactly fixed through attachment to the tablet computer 100.

The foregoing content of the tablet computer 100 and the stylus 200 being fixed through attachment is described. A specific solution for detecting the attachment state of the stylus 200 by the tablet computer 100 is described below.

It should be understood that whether it is fixed through attachment in the positive direction or in the negative direction, the stylus 200 has two states: a state of not being fixed in position through attachment and a state of being fixed in position through attachment relative to the tablet computer 100. That the state of not being fixed in position through attachment means that the stylus 200 is not fixed through attachment to the tablet computer 100. That the state of being fixed in position through attachment means that the stylus 200 is fixed through attachment to the tablet computer 100. That the state of not being fixed in position through attachment is further subdivided into two states: an unattached state and a misattached state. The following uses the positive attachment as an example and illustrates the above states in detail in combination with FIG. 5A and FIG. 5B.

Figure 5A:
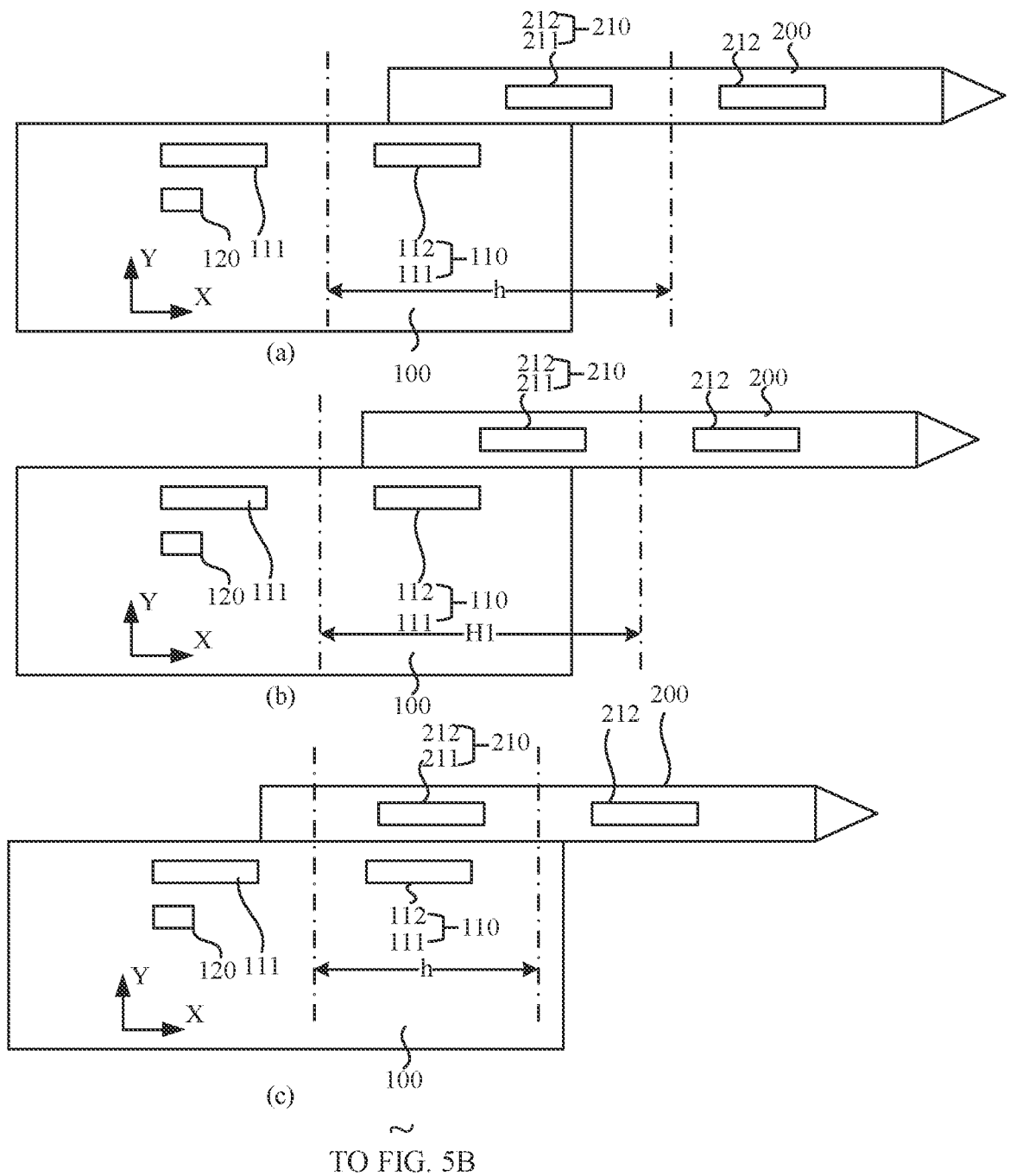
FIG. 5A and FIG. 5B are diagrams of an attachment state of a stylus of the system for detecting proper positioning of an accessory shown in FIG. 2.
Figure 5B:
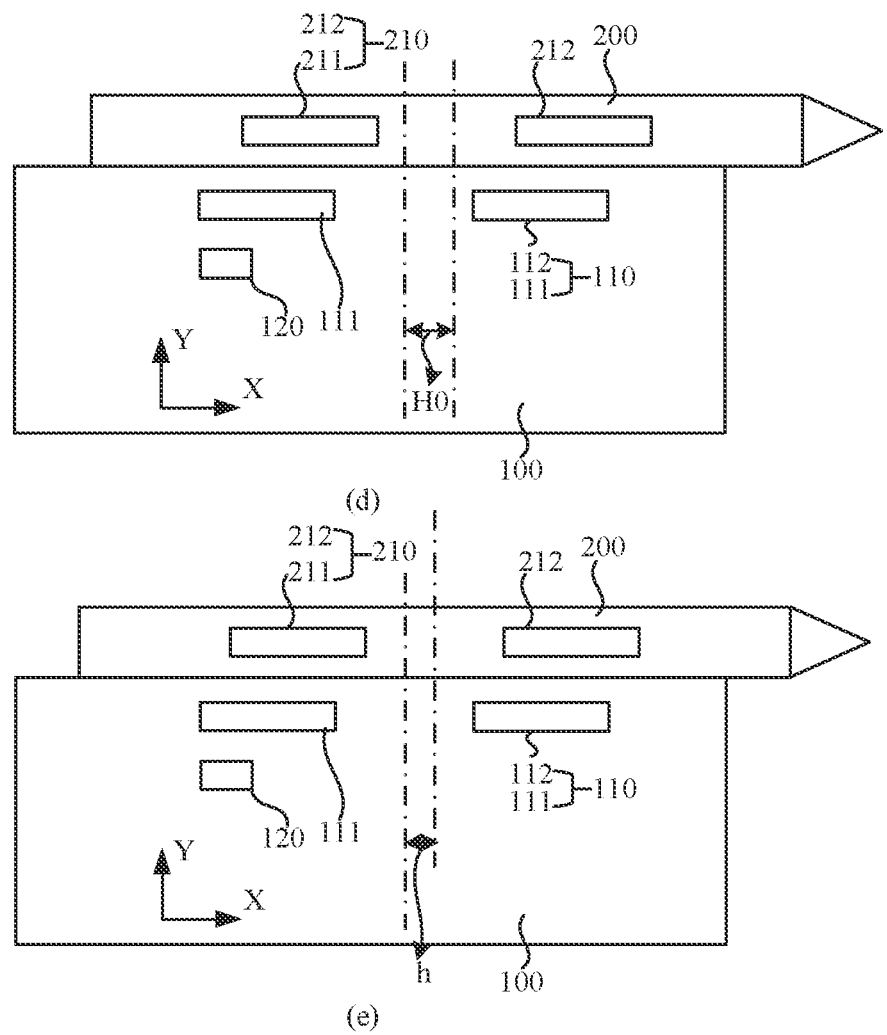

Referring to FIG. 5A and FIG. 5B, FIG. 5A and FIG. 5B illustrate the three states that the stylus needs to go through as the stylus approach the tablet computer in a positive direction.

I. Unattached State:

A state where no force exists between the stylus 200 and the tablet computer 100.

Referring to (a) in FIG. 5A, when a spacing h between the first attachment component 110 and the second attachment component 210 is greater than a spacing H1, the first attachment component 110 and the second attachment component 210 are completely not opposite. In this case, there is no force between the stylus 200 and the tablet computer 100, and the stylus 200 is in the unattached state.

The spacing H1 is a spacing at which the first attachment component 110 is exactly offset from the second attachment component 210, and a spacing at which the first attachment component 110 is offset from the second attachment component 210 when the stylus 200 is exactly misattached. (b) in FIG. 5B shows a case that the spacing H1 between the first attachment component 110 and the second attachment component 210.

II. Misattached State:

A state in which there is a force between the stylus 200 and the tablet computer 100 and the stylus 200 cannot be fixed to the tablet computer 100.

Referring to (c) in FIG. 5A, when the first attachment component 110 and the second attachment component 210 are opposite each other (that is, the first attachment component 110 and the second attachment component 210 are staggered at a spacing less than or equal to H1), but the spacing h between the first attachment component 110 and the second attachment component 210 is greater than the spacing H0, there is a force between the stylus 200 and the tablet computer 100, but the stylus 200 cannot be fixed. In this case, the stylus 200 is in the misattached state.

The spacing H0 is a maximum spacing that the first attachment component 110 and the second attachment component 210 can be offset as being fixed through attachment, that is, the spacing by which the first attachment component 110 is offset from the second attachment component 210 when the stylus 200 is exactly fixed through attachment to the tablet computer 100. (d) in FIG. 5B shows a case that the spacing H0 between the first attachment component 110 and the second attachment component 210.

III. Fixed State Through Attachment:

A state in which the stylus 200 is fixed through attachment to the tablet computer 100, that is, the stylus 200 is fixed in position through attachment. Referring to (e) in FIG. 5B, when the first attachment component 110 and the second attachment component 210 are opposite each other and the spacing h between the first attachment component 110 and the second attachment component 210 is less than or equal to the spacing H0, the stylus 200 may be fixed through attachment to the tablet computer 100. In this case, the stylus 200 is in the fixed state through attachment.

It should be noted that (a) in FIG. 5A to (c) in FIG. 5A are the state of not being fixed in position through attachment; and (d) in FIG. 5B to (e) in FIG. 5B are the state of being fixed in position through attachment.

It should be understood that when the stylus 200 is switched from the state of not being fixed in position through attachment to the state of being fixed in position through attachment, the second attachment component 210 switches from a position farther away from the magnetometer 120 to a position closer to the magnetometer 120. Since the second attachment component 210 can generate a magnetic field, the second attachment component 210 generates two magnetic fields of different strengths at the magnetometer 120. When the stylus 200 is in the state of not being fixed in position, the second attachment component 210 generates a relatively weak magnetic field at the magnetometer 120, or even does not generate the magnetic field; and when the stylus 200 is in the state of being fixed in position, the second attachment component 210 generates a relatively strong magnetic field at the magnetometer 120. In addition, since the first attachment component 110 can also generate the magnetic field, the magnetic field at the magnetometer 120 is acted upon not only by the second attachment component 210, but also by the first attachment component 110.

In a first embodiment, if the design of the first attachment component 110 and the second attachment component 210 causes the magnetic fields synthesized with each other as being fixed through attachment, the magnetic field of the second attachment component 210 is weak and the synthesized magnetic field is weak when the stylus 200 is in a state of not being fixed in position through attachment, because the second attachment component 210 is in a farther position. As a result, the second attachment component 210 and the first attachment component 110 generate a relatively weak magnetic field at the magnetometer 120 when the stylus 200 is in the state of being fixed in position through attachment, the magnetic field of the second attachment component 210 is strong and the synthesized magnetic field is strong because the second attachment component 210 is in a close position. As a result, the second attachment component 210 and the first attachment component 110 generate a relatively strong magnetic field at the magnetometer 120.

In a second embodiment, if the design of the first attachment component 110 and the second attachment component 210 causes the magnetic fields canceled with each other as being fixed through attachment, the magnetic field of the second attachment component 210 is weak and the reduced magnetic field is strong when the stylus 200 is in a state of not being fixed in position through attachment, because the second attachment component 210 is in a farther position. As a result, the second attachment component 210 and the first attachment component 110 generate a relatively strong magnetic field at the magnetometer 120. The magnetic field of the second attachment component 210 is strong and the reduced magnetic field is weak when the stylus 200 is in a state of being fixed in position through attachment, because the second attachment component 210 is in a relatively close position. As a result, the second attachment component 210 and the first attachment component 110 generate a relatively weak magnetic field at the magnetometer 120.

It can be seen from the above that the attachment state of the stylus 200 relative to the tablet computer 100 is different, and the magnetic field strength at the position where the magnetometer 120 is located is different. Based on the above, in the embodiment of this application, the magnetic field strength at the magnetometer 120 is distinguished to determine the attachment state of the stylus 200, so that the tablet computer 100 can perform some subsequent functions.

Figure 6:
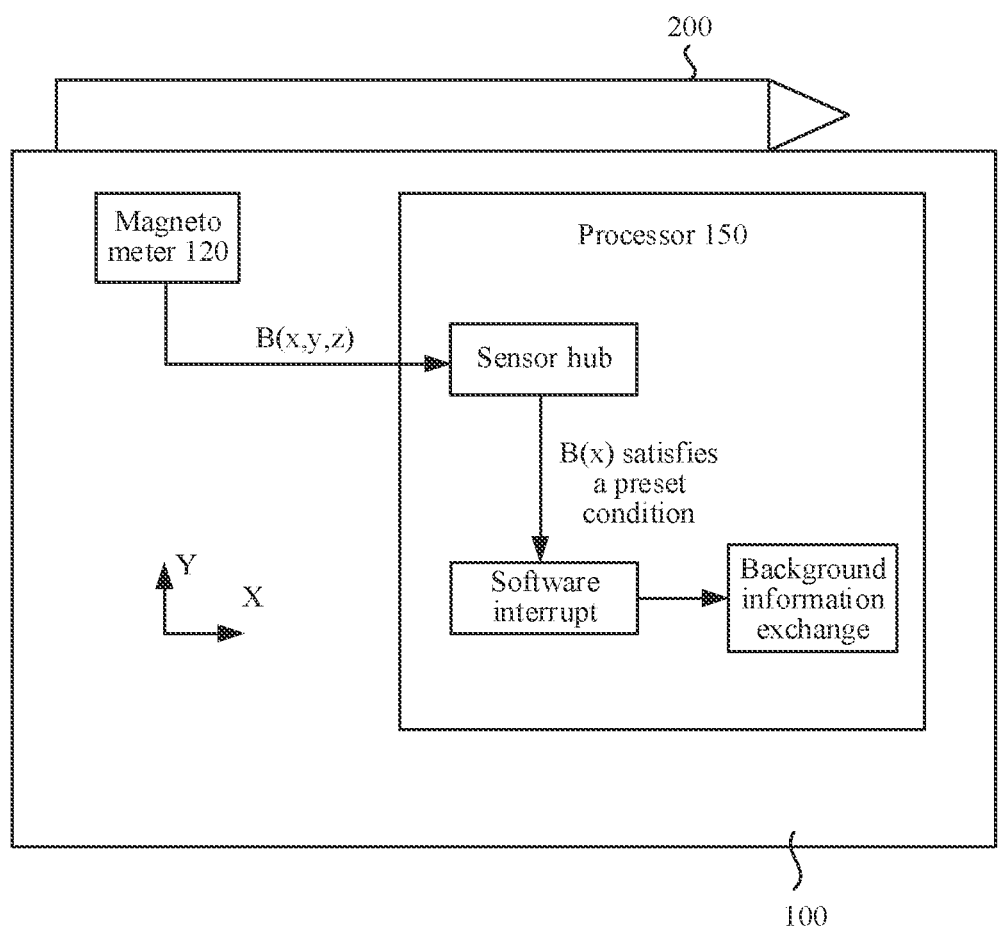
FIG. 6 is an architecture diagram of a detection principle of the system for detecting proper positioning of an accessory shown in FIG. 2.

Specifically, referring to FIG. 6, FIG. 6 is an architecture diagram of a detection principle of the system for detecting proper positioning of an accessory shown in FIG. 2. A processor 150 is connected to a magnetometer 120.

The magnetometer 120 is configured to obtain the magnetic field intensity information of the position, and output the magnetic field intensity information to the processor 150. It should be noted that the magnetometer 120 can obtain a triaxial magnetic component. By setting a mounting orientation of the magnetometer 120, the magnetometer 120 can be made to obtain the magnetic field intensity information in the X axis, Y axis, and in a thickness direction of the tablet computer 100 in this embodiment. In the embodiment of this application, the magnetic field intensity information used for determining the attachment state of the stylus 200 may be the magnetic field intensity information of the X axis.

The processor 150 is configured to: receive the magnetic field intensity information outputted by the magnetometer 120, and determines whether the magnetic field intensity information meets a preset condition, so as to determine the attachment state of the stylus 200. It should be noted that the processor 150 refers to a component that may be configured to execute the foregoing application program code, and invoke related modules to implement functions of the tablet computer 100 in embodiments of this application. The processor 150 may include one or more processing units. For example, the processor 150 may include an application processor (application processor, AP), a modulation and demodulation processor, a graphics processing unit (graphics processing unit, GPU), an image signal processor (image signal processor, ISP), a processor unit, a video encoder and decoder, a digital signal processor (digital signal processor, DSP), a baseband processor, a sensor hub (Sensor Hub) unit, and/or a neural-network processing unit (neural-network processing unit, NPU), or the like. Different processing units may be separate devices or integrated into one or more processors.

Figure 7:
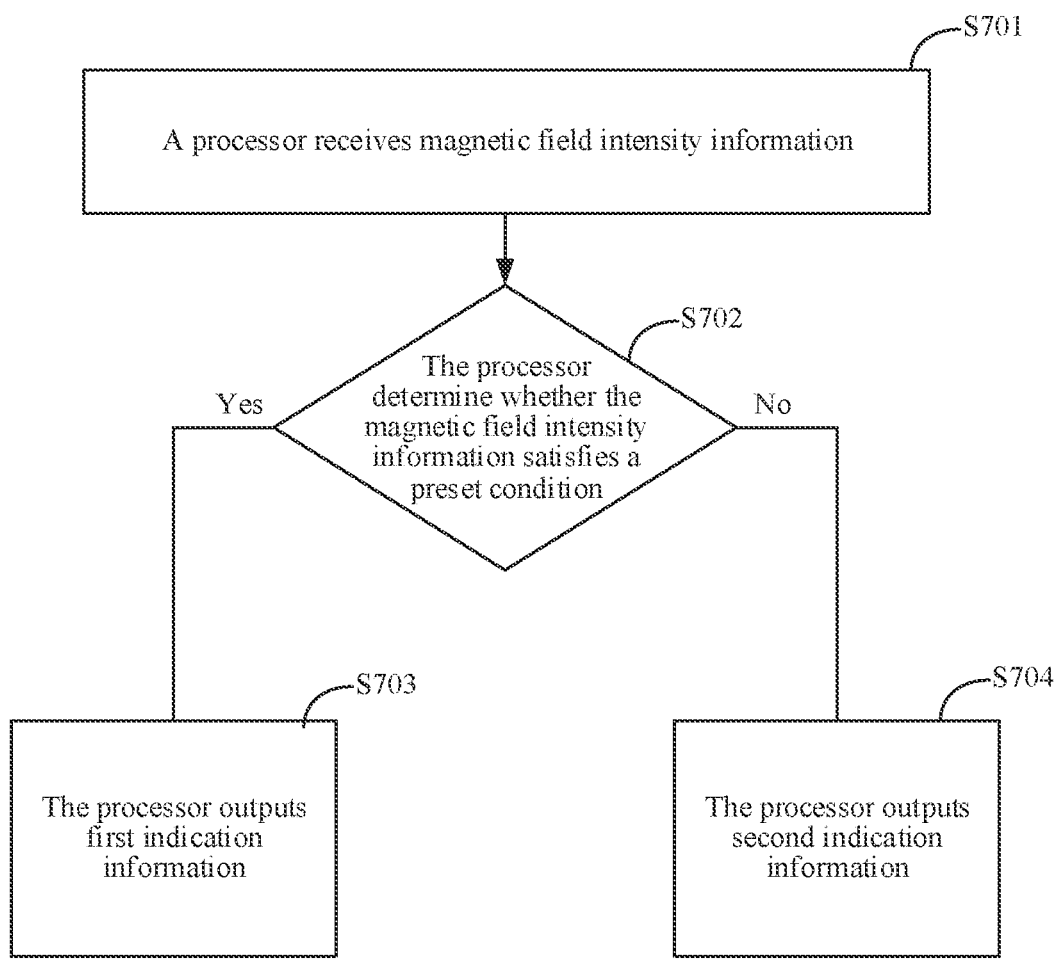
FIG. 7 is a first flowchart in which a processor determines an attachment state of a stylus according to an embodiment of this application.

Based on the above, optionally, the above process of determining whether the magnetic field intensity information satisfies the preset condition may be performed by a sensor hub (Sensor Hub) in the processor 150. Specifically, the sensor hub (Sensor Hub) is configured to: receive the magnetic field intensity information outputted from the magnetometer 120, and determine whether the magnetic field intensity information meets the preset condition. When the magnetic field intensity information meets the preset conditions, a software interrupt is triggered. The processor 150, based on the software interrupt, can determine that the stylus 200 is fixed in position through attachment, and then perform information exchange in the background to facilitate a subsequent function, such as charging the stylus 200, so that the stylus 200 can be charged. Specifically, Referring to FIG. 7, FIG. 7 is a first flowchart in which a processor determines an attachment state of a stylus according to an embodiment of this application. Specifically, the following step S701 and step S704 are included in this embodiment.

S701: The processor receives magnetic field intensity information.

S702: The processor determines whether the magnetic field intensity information meets the preset condition: if so, step S703 is performed; and if not, step S704 is performed.

S703: The processor outputs first indication information.

That the processor outputs first indication information may be understood as the software interrupt in the embodiment shown in FIG. 6.

The first indication information is used for indicating the stylus 200 to be fixed in position through attachment, that is, in a state of being fixed in position through attachment.

S704: The processor outputs second indication information.

The second indication information is used for indicating the stylus 200 not to be fixed in position through attachment, that is, in a state of not being not fixed in position through attachment.

In a specific implementation process, the processor in S701 to S704 may be the sensor hub shown in FIG. 6; and certainly, in other embodiments, if another processing unit in the processor 150 shown in FIG. 6 is implemented, the attachment state of the stylus 200 can be determined by setting a preset threshold in the processor 150 to distinguish the magnetic field strength on the tablet computer 100 in the specific implementation process. That is to say, the determining whether the magnetic field intensity information meets the preset condition may be a process of comparing the magnetic field intensity information with the preset threshold.

Figure 8:
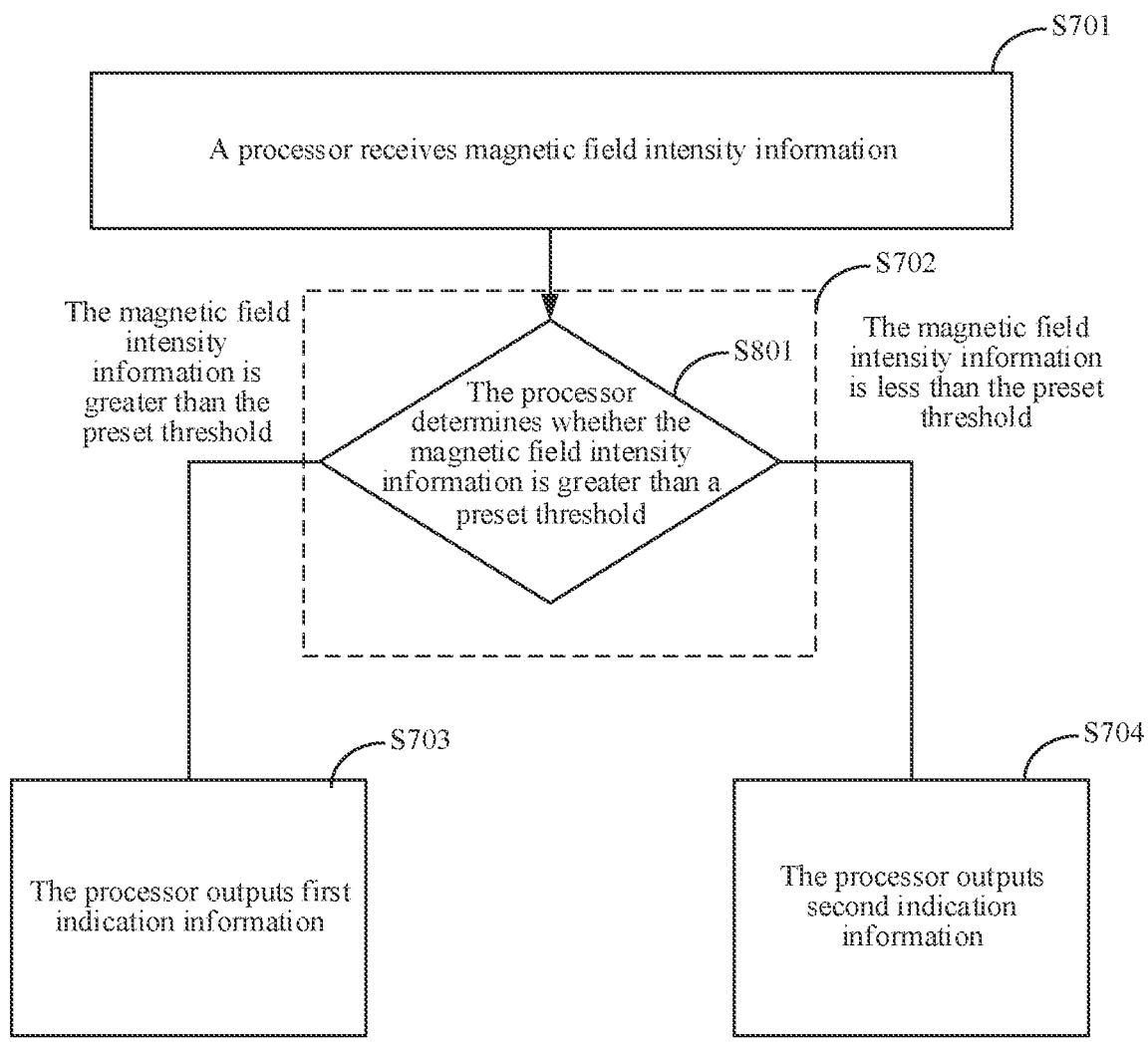
FIG. 8 is a second flowchart in which a processor determines an attachment state of a stylus according to an embodiment of this application.

In some embodiments, referring to FIG. 8, for the first embodiment, whether the magnetic field intensity information in S702 satisfies a preset condition specifically includes the following.

S801: The processor determines whether the magnetic field intensity information is greater than the preset threshold; if the magnetic field intensity information is greater than the preset threshold, step S703 is performed; and if the magnetic field intensity information is less than the preset threshold, step S704 is performed.

Figure 9:
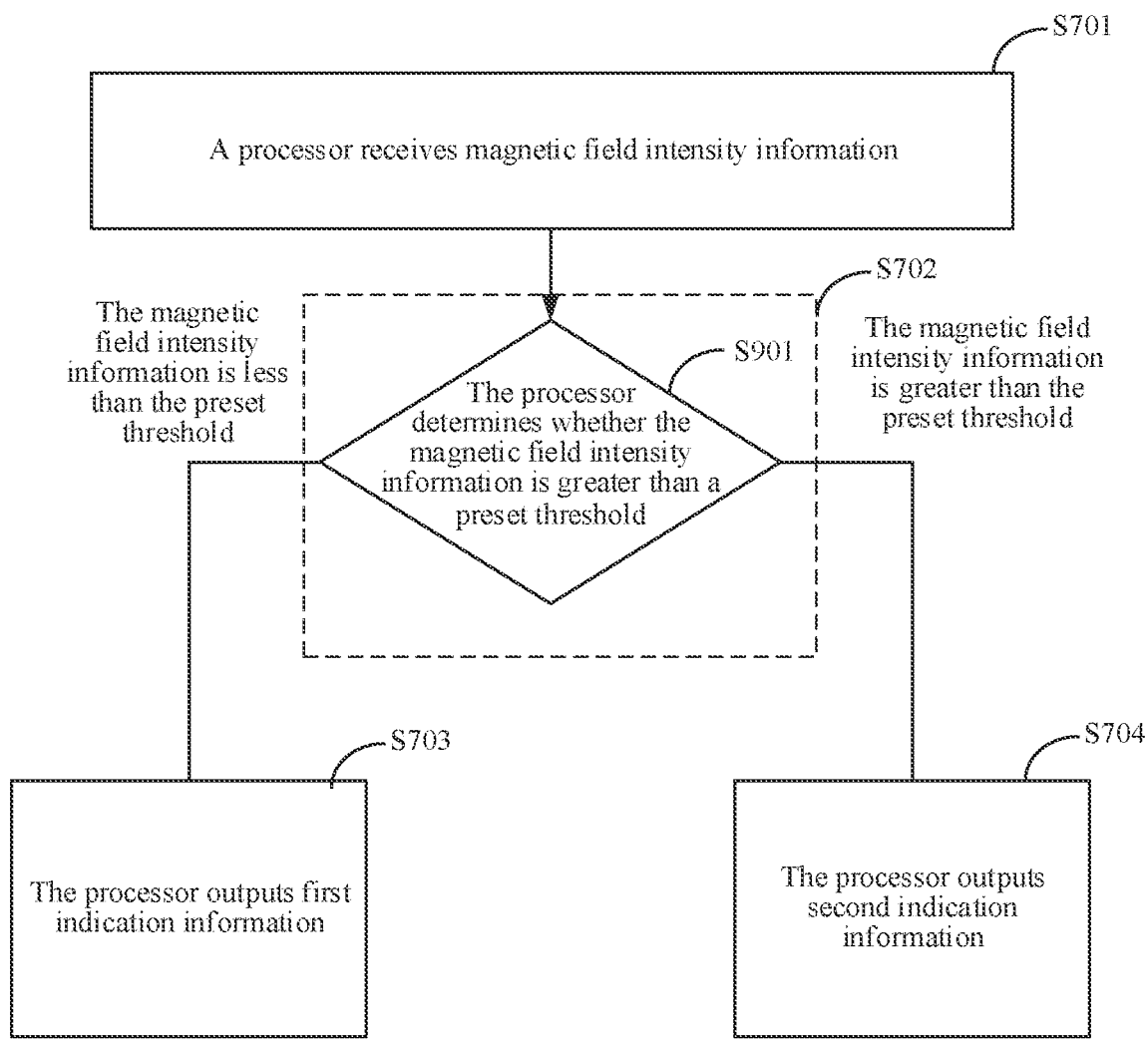
FIG. 9 is a third flowchart in which a processor determines an attachment state of a stylus according to an embodiment of this application.

In some other embodiments, referring to FIG. 9, for the second embodiment, whether the magnetic field intensity information in S702 satisfies a preset condition specifically includes the following.

S901: The processor determines whether the magnetic field intensity information is greater than the preset threshold; if the magnetic field intensity information is less than the preset threshold, step S703 is performed; and if the magnetic field intensity information is greater than the preset threshold, step S704 is performed.

It can be seen that the conditions for determining the attachment state are opposite in FIG. 8 and FIG. 9. The following embodiments are illustrated by the case in FIG. 8, and embodiments based on FIG. 9 may be implemented with adaptive reference, which are not repeated in the following.

As can be seen from the foregoing, the tablet computer 100 determines the attachment state of the stylus 200 based on a change in magnitude of the magnetic field caused by the magnetometer 120 before and after the first attachment component 110 and the second attachment component 210 are fixed through attachment by the stylus 200. It can be seen that the key to realizing the attachment detection solution is that before and after the stylus 200 is fixed through attachment, that is, in the case that the stylus 200 is fixed through attachment to the tablet computer 100 and in the case that the stylus is not fixed to the tablet computer 100 through attachment, the first attachment component 110 and the second attachment component 210 can respectively generate magnetic field intensity information capable of triggering the processor 150 to output the first indication information at the magnetometer 120, and the magnetic field intensity information capable of triggering the processor 150 to output the second indication information. That is to say, the first attachment component 110 and the second attachment component 210 can generate magnetic field intensity information greater than the preset threshold and the magnetic field intensity information less than the preset threshold at the magnetometer 120, respectively.

Based on the above, setting positions of the magnetometer 120, the second attachment component 210, and the first attachment component 110 should meet the following conditions.

When the magnetometer 120 is fixed through attachment to the tablet computer 100 by the stylus 200, the magnetometer is triggered by the magnetic fields of the first attachment component 110 and the second attachment component 210 to output the magnetic field intensity information greater than the preset threshold. On this basis, the first indication information is outputted when the processor 150 receives the magnetic field intensity information. For ease of subsequent description, the embodiment of this application refers to the magnetic field intensity information outputted by the magnetometer 120 jointly triggered by the magnetic field of the first attachment component 110 and the second attachment component 210 when the stylus 200 is fixed through attachment to the tablet computer 100 in the positive direction or in the negative direction as the first magnetic field intensity information.

When the magnetometer 120 is fixed through attachment to the tablet computer 100 by the stylus 200, the magnetometer is triggered by the magnetic fields of the first attachment component 110 and the second attachment component 210 to output the magnetic field intensity information less than the preset threshold. On this basis, the second indication information is outputted when the processor 150 receives the magnetic field intensity information. As can be seen from FIG. 5A and FIG. 5B, the stylus 200 is not fixed through attachment to the tablet computer 100, including two states: the unattached state and the misattached state. For ease of subsequent description, the embodiment of this application refers to the magnetic field intensity information outputted by the magnetometer triggered by the magnetic field of the first attachment component 110 and the second attachment component 210 when the magnetometer 120 is not attached to the tablet computer 100 by the stylus 200 as fourth magnetic field intensity information. The embodiment of this application refers to the magnetic field intensity information triggered by the magnetic field of the first attachment component 110 and the second attachment component 210 outputted by the magnetometer 120 when the stylus 200 is misattached to the tablet computer 100 as third magnetic field intensity information.

It should be noted that the foregoing trigger by the magnetic field of the first attachment component 110 and the second attachment component 210 refers only to a common magnetic field trigger of the first attachment component 110 and the second attachment component 210 at the magnetometer 120. That is, there may be no magnetic field of the second attachment component 210 in the common magnetic field, not that both the first attachment component and the second attachment component need to generate the magnetic field at the magnetometer 120 for triggering.

Specifically, as can be seen from the foregoing, when the stylus 200 is fixed through attachment to the tablet computer 100, the second attachment component 200 generates a relatively strong magnetic field at the magnetometer 120. On this basis, that the magnetometer is triggered by the magnetic fields of the first attachment component 110 and the second attachment component 210 when the magnetometer 120 is fixed through attachment to the tablet computer 100 by the stylus 200 means that the magnetometer 120 is triggered by the magnetic fields of the two devices of the first attachment component 110 and the second attachment component 210.

However, when the stylus 200 is not fixed through attachment to the tablet computer 100, the second attachment component 200 generates a relatively weak magnetic field at the magnetometer 120, or even does not generate the magnetic field. On this basis, that the magnetometer is triggered by the magnetic fields of the first attachment component 110 and the second attachment component 210 when the magnetometer 120 is fixed through attachment to the tablet computer 100 by the stylus 200 should not be understood that the magnetometer is triggered by the magnetic fields of the two devices of the first attachment component 110 and the second attachment component 210. Specifically, when the second attachment component 200 generates a relatively weak magnetic field at the magnetometer 120, the stylus is triggered by the magnetic fields of the two devices of the first attachment component 110 and the second attachment component 210; however, when the second attachment component 200 does not generate the magnetic field at the magnetometer 120, the stylus is triggered by the magnetic field of the first attachment component 110. From another perspective, the latter case can be understood as being triggered by the magnetic fields of the two devices of the first attachment component 110 and the second attachment component 210, except that the magnetic field generated by the second attachment component 210 at the magnetometer 120 is zero. For ease of distinction, the embodiment of this application refers to the magnetic field intensity information outputted by the magnetometer 120 triggered only by the magnetic field of the first attachment component 110 as second magnetic field intensity information.

As can be seen from the above, in the system for detecting proper positioning of an accessory shown in FIG. 2, the magnetic field intensity information generated by the second attachment component 210 and the first attachment component 110 at the position of the magnetometer 120 is obtained by the magnetometer 120, and the magnetic field intensity information detected by the magnetometer 120 is distinguished by the processor 150, so as to accurately determine whether the stylus 200 is fixed in position through attachment. In addition, the second attachment component 210 and the first attachment component 110 can trigger the magnetometer 120 to output the first magnetic field intensity information capable of causing the processor 150 to output the first indication information when the stylus 200 is fixed through attachment to the tablet computer 100 in the positive direction or in the negative direction, so as to realize the detection when the two orientations are fixed in place.

It can be seen that in the system for detecting proper positioning of an accessory shown in FIG. 2, the detection of the stylus 200 when the stylus is fixed in position through attachment in a positive direction or in a negative direction is realized by arranging one magnetometer 120 in the tablet computer 100 and using the existing second attachment component 210 in the stylus 200 and the existing first attachment component 110 in the tablet computer 100. Compared with the attachment detection solution shown in FIG. 1, one magnetometer 120 is added, but the expense of one detection magnet and two Hall devices is saved, and the cost of consumables is greatly reduced. Moreover, when the overhead of two Hall devices is saved, the consumption of these accessories is naturally saved, and the cost of consumables is saved. Meanwhile, a main board area and internal space of the tablet computer 100 are also saved. On the other hand, since the system for detecting proper positioning of an accessory in this embodiment does not need to separately provide a detection magnet for engaging with the magnetometer 120 in the stylus 200, the cost of consumables for the detection magnet and the occupied space of the detection magnet are saved.

In addition, the processor 150 determines the solution of the attachment state of the stylus 200 through a comparison result of the preset threshold and the magnetic field intensity information, which belongs to the solution of software-triggered interrupt. When the preset threshold is not set reasonably, the preset threshold can be adjusted at any time to adjust an interrupt trigger condition. Compared with the manner of directly outputting hardware interrupts through the Hall switch, the adjustment of the preset threshold is more flexible and the implementation cost is lower.

It should be noted that in the usual attachment detection solution, as shown in FIG. 1, an independent detection magnet will be provided for triggering the Hall device instead of using the attachment component. Therefore, the overall design idea of FIG. 1 is that the detection magnet and the Hall device are configured to detect the attachment state, and the attachment component is only used for attachment, and the two are completely decoupled in function and do not interfere with each other. In this solution, the preset threshold for distinguishing the magnitude of the magnetic field intensity determines the outputted magnetic field intensity information based on an absence of another magnetic field device around the Hall device (a device capable of generating the magnetic field other than the detection magnet such as the first attachment component 110 and the second attachment component 210). Moreover, the Hall device configured to obtain the magnetic field intensity information of the detection magnet should be kept away from these magnetic field devices to avoid these magnetic field devices affecting the magnetic field at the position of the Hall device, thereby affecting erroneous determination of the attachment state. The reasons are as follows. If the first attachment component 110 is close to the Hall device, the magnetic field strength generated by the stylus 200 at the Hall device reaches the preset threshold more easily. In this way, when the stylus 200 is not fixed in position through attachment, the preset threshold is sent, resulting in the erroneous determination.

In the system for detecting proper positioning of an accessory shown in FIG. 2, in order to save the cost of consumables, the second attachment component 210 in the stylus 200 is directly multiplexed as a device for triggering the magnetometer 120, and is no longer arranged separately. It can be seen that an overall design idea of FIG. 2 is that the second attachment component 210 is not only used for attachment with the first attachment component 110, but also for triggering the magnetometer 120 to detect the attachment state. That is to say, different from the concept of the scheme shown in FIG. 1—the Hall device needs to be away from other magnetic field devices to avoid the influence of the magnetic field of these magnetic field devices, the concept of the scheme shown in FIG. 2 is properly the opposite—the magnetometer 120 needs to be as close as possible to these magnetic field devices, and use the magnetic field of these magnetic field devices to trigger. On this basis, in the solution shown in FIG. 2, the preset threshold for distinguishing the magnitude of the magnetic field strength is determined based on the magnetic field intensity information outputted by the magnetometer 120 when these magnetic field devices exist around the magnetometer; and the magnetometer 120 for obtaining the magnetic field intensity does not need to be deliberately away from or close to these magnetic field devices. The reasons are as follows. The magnetic field generated by these magnetic field devices at the magnetometer 120 is considered due to the preset threshold. In this case, even if these magnetic field devices are close to the magnetometer 120, these magnetic field devices only affect part of the first preset threshold that belongs to the magnetic field device itself, and do not cause the magnetic field intensity generated by the stylus 200 at the magnetometer 120 easier to reach the preset threshold.

Based on the difference in the above concept, the setting of the specific position of the magnetometer 120 in the tablet computer 100 is described first.

Since the magnetometer 120 does not need to be deliberately away from or close to the second attachment component 210 (as being fixed through attachment) and the first attachment component 110, the magnetometer 120 may be arranged at a position farther from the second attachment component 210 (as being fixed through attachment) and the first attachment component 110, or may be a position closer. As long as the position where the magnetometer 120 is located meets the conditions that the setting positions of the magnetometer 120, the second attachment component 210, and the first attachment component 110 should meet, the embodiment of this application does not specifically limit the setting position of the magnetometer 120.

On this basis, in some embodiments, when the magnetometer 120 used by an electronic compass in the tablet computer 100 can meet the above conditions, the magnetometer 120 can share the magnetometer 120 (the magnetometer 120 used by the electronic compass) that exists on the tablet computer 100, and there is no need to arrange another one separately, thereby reducing the cost of consumables.

It should be understood that if the distance between the magnetometer 120 and the attachment side edge of the tablet computer 100 is far, the magnetic field generated by the first attachment component 110 at the magnetometer 120 is weak; and when the second attachment component 210 is fixed through attachment to the tablet computer 100 by the stylus 200, the magnetic field generated at the magnetometer 120 is also weak. That is to say, the magnetic field intensity measured by the magnetometer 120 when the stylus 200 is fixed through attachment, and the magnetic field intensity measured when the stylus 200 is not fixed through attachment are very weak and the difference is small. In this case, in order to distinguish different attachment states based on the magnetic field intensity, in the process of the stylus 200 constantly approaching the tablet computer 100, the magnetometer 120 needs to be able to finely detect the magnetic field intensity at each moment, which requires weak sensitivity of the magnetometer 120.

On this basis, in some other embodiments, still referring to FIG. 2, the magnetometer 120 and the first attachment component 110 are arranged side by side in a third direction and are located on one side of the center line of the first attachment component 110. In this case, the magnetometer 120 may be arranged side by side with the first attachment member 111 in the third direction. The third direction is perpendicular to the first direction and the thickness direction of the electronic device 100, that is, the direction in which the Y axis is located in the figure. In this way, when the stylus 200 is fixed through attachment to the tablet computer 100, the second attachment component 210 can generate a strong magnetic field at the magnetometer 120, reducing a sensitivity requirement for the magnetometer 120.

Moreover, it should be further noted that, in order to correctly detect the foregoing magnetic field change, when selecting the magnetometer 120, a range of the magnetometer 120 should not be less than the foregoing first magnetic field intensity information and the third magnetic field intensity information. Otherwise, the magnetic field intensity information outputted by the magnetometer 120 cannot reflect a real magnetic field at the position where the magnetometer 120 is located, which is prone to occur erroneous determination.

Next, based on the difference in the above concept, the setting of the preset threshold in FIG. 8 is described below.

In a first case, the preset threshold in FIG. 8 is determined based on the second magnetic field intensity information. Specifically, the second magnetic field intensity information itself can be determined as the preset threshold, and it can be determined as the preset threshold after leaving a margin on the second magnetic field intensity information. The preset threshold is subsequently referred to as the first preset threshold. On this basis, the embodiment of this application provides an embodiment shown in FIG. 10 based on FIG. 8.

Figure 10:
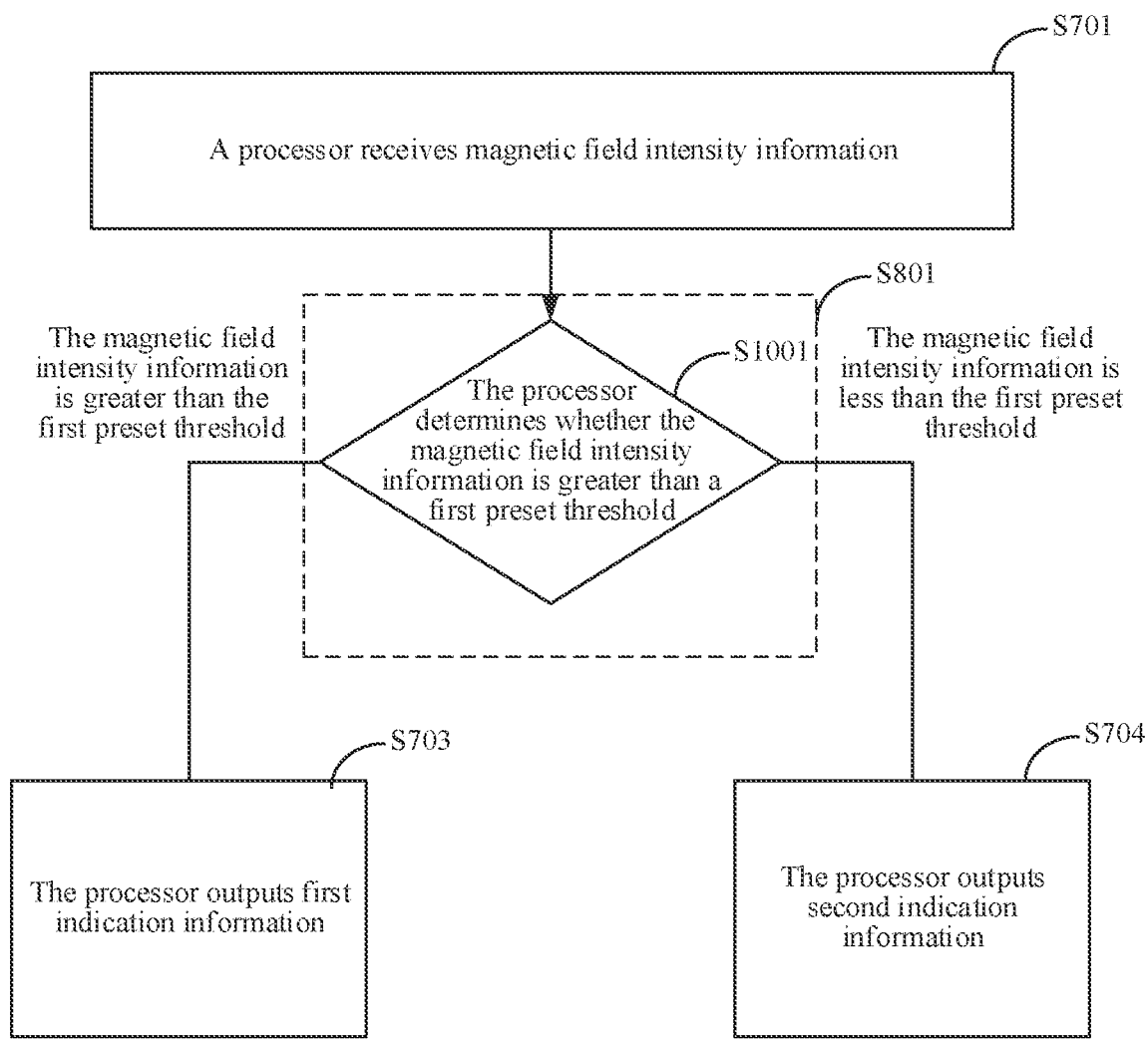
FIG. 10 is a fourth flowchart in which a processor determines an attachment state of a stylus according to an embodiment of this application.

Referring to FIG. 10, FIG. 10 is a fourth flowchart in which a processor determines an attachment state of a stylus according to an embodiment of this application. Different from the embodiment shown in FIG. 8, S801 specifically includes the following.

Step S1001: The processor determines whether the magnetic field intensity information is greater than the first preset threshold. If the magnetic field intensity information is greater than the first preset threshold, step S703 is performed: and if the magnetic field intensity information is less than the first preset threshold, step S704 is performed.

In the specific implementation process, S704 can be performed when the magnetic field intensity information is equal to the first preset threshold.

It should be noted that still referring to FIG. 2, the first magnetic field intensity information is outputted by the common triggering of the magnetic fields of the two devices of the first attachment component 110 and the second attachment component 210 when the magnetometer 120 is fixed through attachment by the stylus 200. The second magnetic field intensity information is outputted by the magnetometer 120 triggered only by the magnetic field of the first attachment component 110. It should be understood that the magnetic field intensity generated by a complex of the first attachment component 110 and the second attachment component 210 at the magnetometer 120 is greater than the magnetic field intensity generated at the magnetometer 120 by a single first attachment component 110. Therefore, the first magnetic field intensity information is greater than the second magnetic field intensity information. Since the first preset threshold is obtained based on the second magnetic field intensity information, the first magnetic field intensity information is greater than the first preset threshold. On this basis, in the system for detecting proper positioning of an accessory shown in FIG. 2, when the stylus 200 is fixed through attachment to the tablet computer 100 in the positive direction or in the negative direction, the first attachment component 110 and the second attachment component 210 cause the magnetometer 120 to output the first magnetic field intensity information greater than the first preset threshold. Upon receiving the first magnetic field intensity information greater than the first preset threshold, the processor 150 outputs the first indication information to prompt the stylus 200 to be fixed in position through attachment.

It should be noted that the second magnetic field intensity information can be obtained in the following two manners.

In some implementations, still referring to FIG. 2, the magnetometer 120 is specifically configured to output the magnetic field intensity information only triggered by the magnetic field of the first attachment member 111 in the first attachment component 110 when the stylus 200 is not fixed through attachment to the tablet computer 100, but not triggered by the magnetic field of the second attachment member 112. In this case, the second magnetic field intensity information is the magnetic field intensity information outputted by magnetometer 120 triggered only by the magnetic field of the first attachment member 111 in the first attachment component 110. Since the first preset threshold is determined by the second magnetic field intensity information, the second attachment member 112 is not considered in the first preset threshold. In this case, in order to avoid erroneous determination, further, the magnetometer 120, the second attachment component 210, and the first attachment component 110 shall be arranged in a position that satisfies the following conditions.

The magnetometer 120 is specifically configured to: output the first magnetic field intensity information greater than the first preset threshold when the stylus 200 is fixed through attachment to the tablet computer 100 in the positive direction, which is triggered by the magnetic fields of the first attachment member 111 and the third attachment member 211 together, but not triggered by the magnetic field of the fourth attachment member 212; and output the first magnetic field intensity information greater than the first preset threshold is outputted when the stylus 200 is fixed through attachment to the tablet computer 100 in the negative direction, which is triggered by the magnetic fields of the magnetic fields of the first attachment member 111 and the fourth attachment member 212 together, and not triggered by the magnetic field of the third attachment member 211. For the reason, refer to the process in FIG. 1 in which proximity of the first attachment component 110 to the Hall device causes erroneous determination, which is not be repeated here.

In the specific implementation process, still referring to FIG. 2, by changing the first spacing d1 of the first attachment member 111 and the second attachment member 112 in the direction of the X axis, the first attachment member 111 can generate a magnetic field at the magnetometer 120, while the second attachment member 112 does not affect the magnetic field at the magnetometer 120. That the second attachment member 112 does not affect the magnetic field at the magnetometer 120 means that the presence or absence of the second attachment member 112 does not cause a change in the magnetic field at the magnetometer 120. In other words, the second attachment member 112 produces almost no magnetic field at the magnetometer 120. In this case, the magnetic field intensity information outputted by the magnetometer 120 is the required second magnetic field intensity information.

Moreover, by changing the second spacing d2 between the third attachment member 211 and the fourth attachment member 212 in the direction of the X axis, the fourth attachment member 212 does not affect the magnetic field at the magnetometer 120 when the stylus 200 is positively fixed through attachment; and the third attachment member 211 does not affect the magnetic field at the magnetometer 120 when the stylus is fixed through attachment in the negative direction. That is to say, once the third attachment member 211 and the fourth attachment member 212 begin to affect the magnetic field at the position where the magnetometer 120 is located, the stylus 200 is no longer fixed through attachment.

Figure 11:
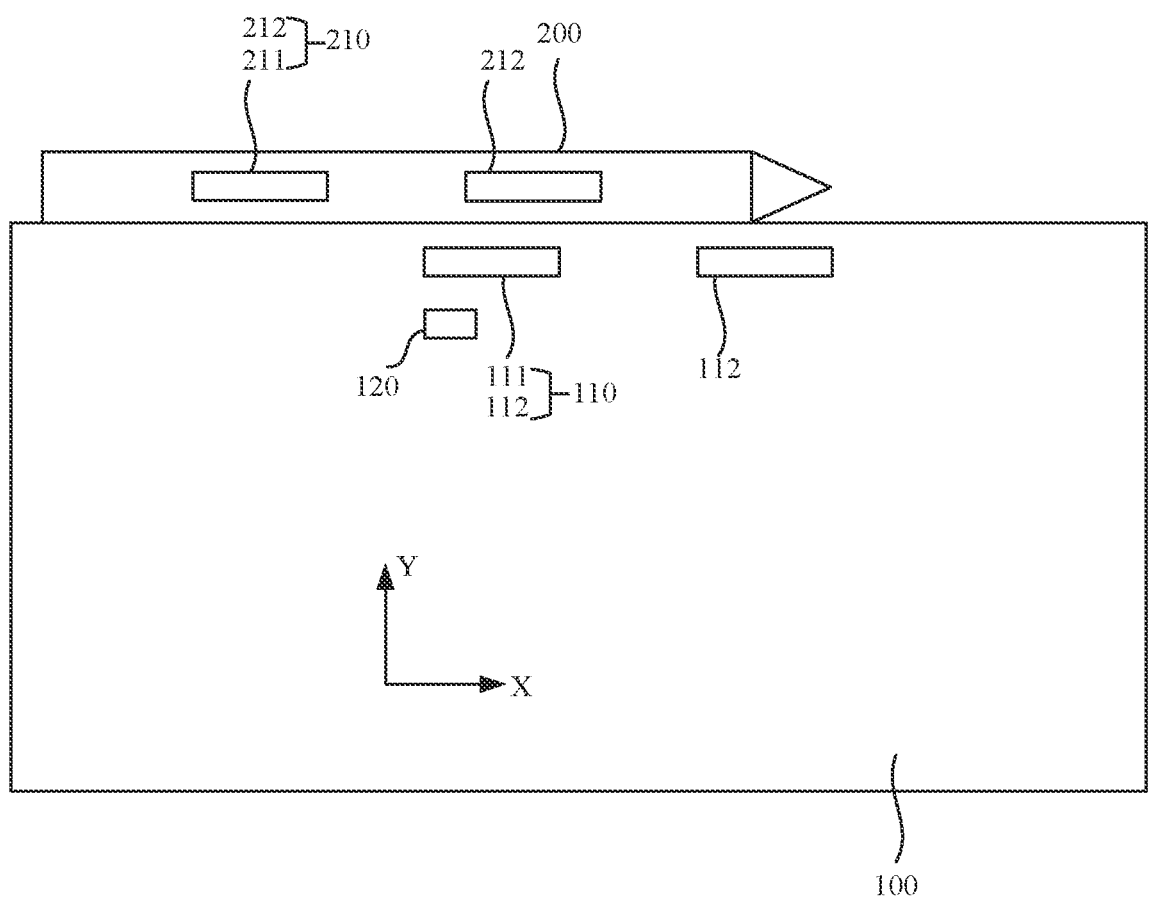
FIG. 11 is a possible accidental trigger scenario of the system for detecting proper positioning of an accessory shown in FIG. 2.

On this basis, referring to FIG. 11, FIG. 11 is a possible accidental trigger scenario of the system for detecting proper positioning of an accessory shown in FIG. 2. In this figure, the fourth attachment member 212 may trigger the magnetometer 120 to output the first indication information, but since the stylus 200 is no longer fixed through attachment, the user can perceive that the stylus 200 is not fixed through attachment, so as to be fixed in position through attachment further. Therefore, the accidental trigger scenario shown in FIG. 11 basically does not exist. In other embodiments, if the first attachment component 110 and the second attachment component 210 use the Hellbeck array, when the scenario of FIG. 11 occurs, either the first attachment component 110 and the second attachment component 210 repel each other, so that the stylus 200 is far away from the tablet computer 100, and the fourth attachment member 212 no longer affects the magnetic field at the magnetometer 120, or the first attachment component 110 and the second attachment component 210 are moved closer to each other so that the stylus 200 is fixed to the tablet computer 100 through attachment.

In some other implementations, still referring to FIG. 2, the magnetometer 120 is specifically configured to output the magnetic field intensity information by being jointly triggered by the magnetic fields of the first attachment member 111 and the second attachment member 112 when the stylus 200 is not fixed through attachment to the tablet computer 100. In this case, the second magnetic field intensity information is the magnetic field intensity information outputted by magnetometer 120 triggered by the magnetic field of the first attachment member 111 and the second attachment member 112. Since the first preset threshold is determined by the second magnetic field intensity information the second attachment member 112 is considered in the first preset threshold. In this case, in order to avoid erroneous determination, the magnetometer 120, the second attachment component 210, and the first attachment component 110 shall be set in a position that satisfies the following conditions.

The magnetometer 120 is specifically configured to: output the first magnetic field intensity information greater than the first preset threshold triggered by the magnetic fields (most of the magnetic field comes from the first attachment member 111 and the third attachment member 211, and a small part comes from the second attachment member 112 and the fourth attachment member 212) of the first attachment component 110 and the second attachment component 210 when the stylus 200 is fixed through attachment to the tablet computer 100 in the positive direction: and output the first magnetic field intensity information greater than the first preset threshold triggered by the magnetic fields (most of the magnetic field comes from the first attachment member 111 and the fourth attachment member 212, and a small part comes from the second attachment member 112 and the third attachment member 211) of the first attachment component 110 and the second attachment component 210 when the stylus 200 is fixed through attachment to the tablet computer 100 in the negative direction.

In the specific implementation process, still referring to FIG. 2, by changing the first spacing d1 of the first attachment member 111 and the second attachment member 112 in the direction of the X axis, the first attachment member 111 and the second attachment member 112 generate the magnetic field at the magnetometer 120. In this case, the magnetic field intensity information outputted by the magnetometer 120 is the required first magnetic field intensity information. Moreover, by changing the second spacing d2 between the third attachment member 211 and the fourth attachment member 212 in the direction of the X axis, the third attachment member 211 and the fourth attachment member 212 both affect the magnetic field at the position where the magnetometer 120 is located when the stylus 200 is fixed through attachment in the positive direction and in the negative direction.

It should be noted that when the stylus 200 is fixed through attachment to the tablet computer 100, although the first attachment component 110 and the second attachment component 210 can generate the first magnetic field intensity information greater than the first preset threshold value at the magnetometer 120, thereby realizing a determination of the state in which the stylus 200 is fixed in position through attachment, in the first case described above, since the first preset threshold is obtained based on the second magnetic field intensity information outputted by the magnetometer 120 triggered by the magnetic field of the first attachment component 110, the magnetometer 120 is caused to output the magnetic field intensity information greater than the first preset threshold as long as the second attachment component 210 slightly generates the magnetic field at the magnetometer 120, thereby outputting the first indication information to prompt the stylus 200 to be attached in place. On this basis, if the second attachment component 210 generates the magnetic field at the magnetometer 120 when the stylus 200 is in the unattached state and the misattached state as described above, the magnetometer 120 is caused to output the magnetic field intensity information greater than the first preset threshold, thereby outputting the first indication information to prompt that the stylus 200 is attached in position, and generating the erroneous determination. On this basis, when the preset threshold is selected as the first preset threshold, it is necessary to ensure that the second attachment component 210 cannot affect the magnetic field at the magnetometer 120 when the stylus 200 is not fixed to the tablet computer 100 through attachment (that is, the stylus 200 is in the state of not being fixed in position through attachment, including the unattached state and the misattached state). That is to say, the magnetometer 120 needs to be not covered by the magnetic field of the second attachment component 210 when the spacing by which the second attachment component 210 is offset from the first attachment component 110 is greater than the spacing H0.

In a second case, the preset threshold for distinguishing the intensity of the magnetic field in FIG. 8 may be the second preset threshold. The second preset threshold is determined based on the third magnetic field intensity information outputted by the magnetometer 120 when the stylus 200 is exactly misattached to the tablet computer 100. The third magnetic field intensity information is defined above and is not be described here. "Exact misattachment" and "misattachment" are explained in the misattached state and is not be described here. Specifically, the value of the second preset threshold may refer to the implementation of the first preset threshold, which is not be repeated here. On this basis, the embodiment of this application provides an embodiment shown in FIG. 12 based on FIG. 8.

Figure 12:
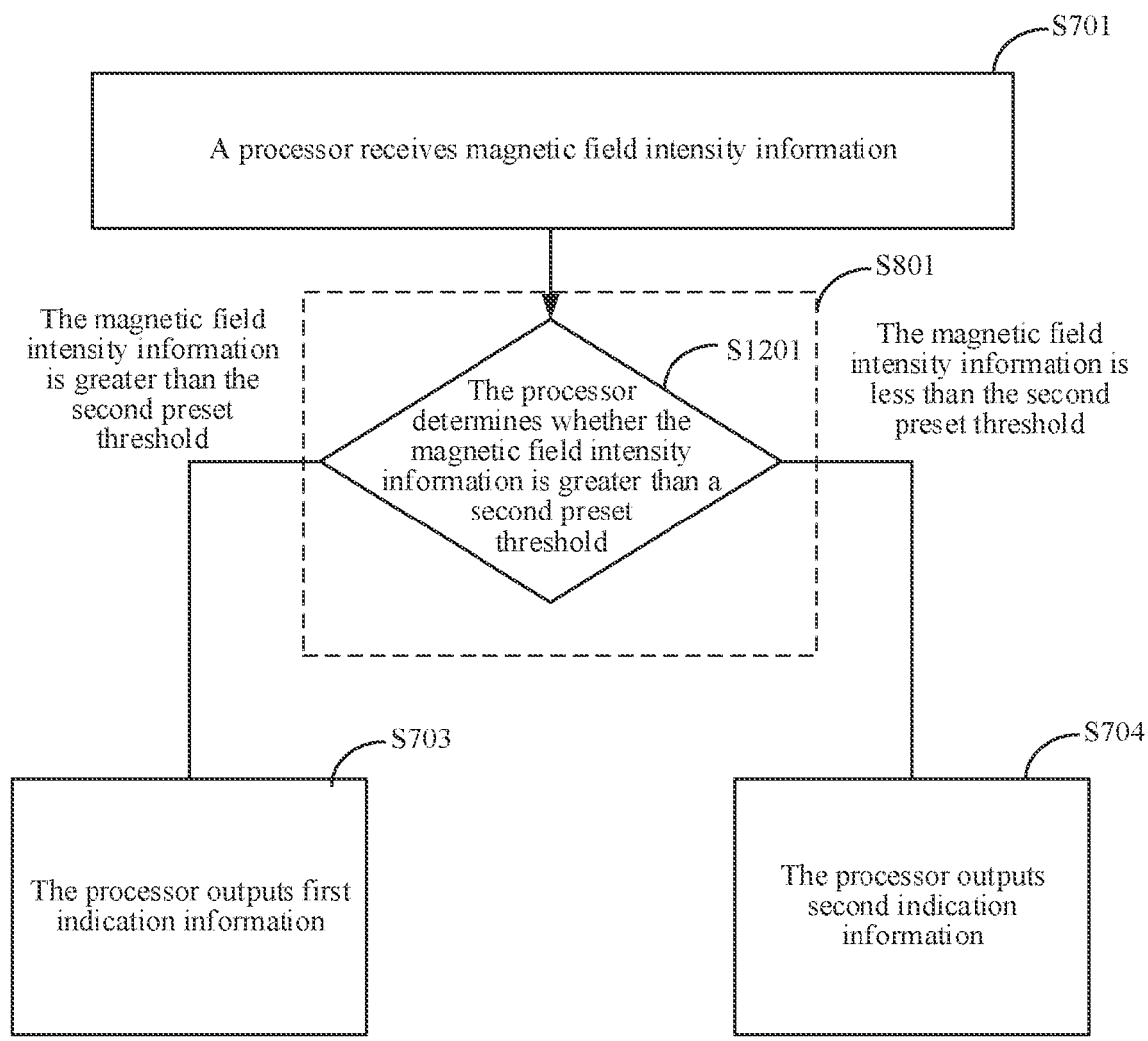
FIG. 12 is a fifth flowchart in which a processor determines an attachment state of a stylus according to an embodiment of this application.

Referring to FIG. 12, FIG. 12 is a fifth flowchart in which a processor determines an attachment state of a stylus according to an embodiment of this application. Different from the embodiment shown in FIG. 8, S801 specifically includes the following.

S1201: The processor determines whether the magnetic field intensity information is greater than the second preset threshold; If the magnetic field intensity information is greater than the second preset threshold, step S703 is performed; and if the magnetic field intensity information is less than the second preset threshold, step S704 is performed.

In the specific implementation process, S704 can be performed when the magnetic field intensity information is equal to the second preset threshold.

It should be noted that the second attachment component 210 is offset from the first attachment component 110 by a smaller spacing when the stylus 200 is fixed through attachment to the tablet computer 100, and the distance from the magnetometer 120 is closer, as compared to the misattached state. In this case, the first magnetic field intensity information generated by the second attachment component 210 and the first attachment component 110 at the magnetometer 120 is greater than the third magnetic field intensity information. Since the second preset threshold is determined by the third magnetic field intensity information, the first magnetic field intensity information is greater than the second preset threshold. On this basis, when the stylus 200 is fixed through attachment to the tablet computer 100 in the positive direction or in the negative direction, the processor 150 receives the first magnetic field intensity information that is greater than the second preset threshold, thereby outputting the first indication information to indicate that the stylus 200 is fixed in position through attachment.

Moreover, compared with the misattached state, when the stylus 200 is in the unattached state, the spacing by which the second attachment component 210 is offset from the first attachment component 110 is greater, and the distance from the magnetometer 120 is further. In this case, the fourth magnetic field intensity information generated by the second attachment component 210 and the first attachment component 110 at the magnetometer 120 is less than the third magnetic field intensity information. Since the second preset threshold is determined by the third magnetic field intensity information, the fourth magnetic field intensity information is less than the second preset threshold. On this basis, when the stylus 200 is not attached to the tablet computer 100, the processor 150 receives the fourth magnetic field intensity information that is less than the second preset threshold, thereby outputting the second indication information to indicate that the stylus 200 is not fixed in position through attachment. In this case, the stylus 200 is not attached. On this basis, further, in S704 shown in FIG. 12, the second indication information is not only used for indicating that the stylus 200 is not fixed in position through attachment, but also can be used for indicating that the stylus 200 is not attached, that is, the stylus is in the unattached state.

However, the second preset threshold is obtained based on the third magnetic field intensity information outputted by magnetometer 120 when the stylus 200 is exactly misattached; therefore, compared with the exactly misattached state, when the stylus 200 is in the misattached state, the spacing by which the second attachment component 210 is offset from the first attachment component 110 is less, and the distance from the magnetometer 120 is closer. In this case, the third magnetic field intensity information generated by the second attachment component 210 and the first attachment component 110 at the magnetometer 120 is greater than the third magnetic field intensity information as being exactly misattached. On this basis, when the stylus 200 is fixed through attachment to the tablet computer 100 in the positive direction or in the negative direction, the processor 150 receives the third magnetic field intensity information that is greater than the second preset threshold, thereby outputting the first indication information to indicate that the stylus 200 is fixed in position through attachment. Further, the erroneous determination occurs. On this basis, when the preset threshold is selected as the second preset threshold, it is necessary to ensure that the second attachment component 210 cannot affect the magnetic field at the magnetometer 120 when the stylus 200 is in the misattached state. That is to say, the magnetometer 120 needs to be not covered by the magnetic field of the second attachment component 210 when the spacing by which the second attachment component 210 is offset from the first attachment component 110 is greater than the spacing H0 and less than or equal to the spacing H1.

It should be noted that an acquisition manner for determining the third magnetic field intensity information of the second preset threshold can refer to the specific implementation of the second magnetic field intensity information in the first case. In this case, the specific implementation of the position of the magnetometer may also result in a specific implementation of the first case.

In a third case, the preset threshold for distinguishing the intensity of the magnetic field in may be the third preset threshold. The third preset threshold is determined based on the first magnetic field intensity information outputted by the magnetometer 120 when the stylus 200 is exactly fixed through attachment to the tablet computer 100. "The third magnetic field intensity information" and "exactly fixed through attachment" are defined explained above and is not be described here. Specifically, the value of the third preset threshold may refer to the implementation of the first preset threshold, which is not be repeated here. On this basis, the embodiment of this application provides an embodiment shown in FIG. 13 based on FIG. 8.

Figure 13:
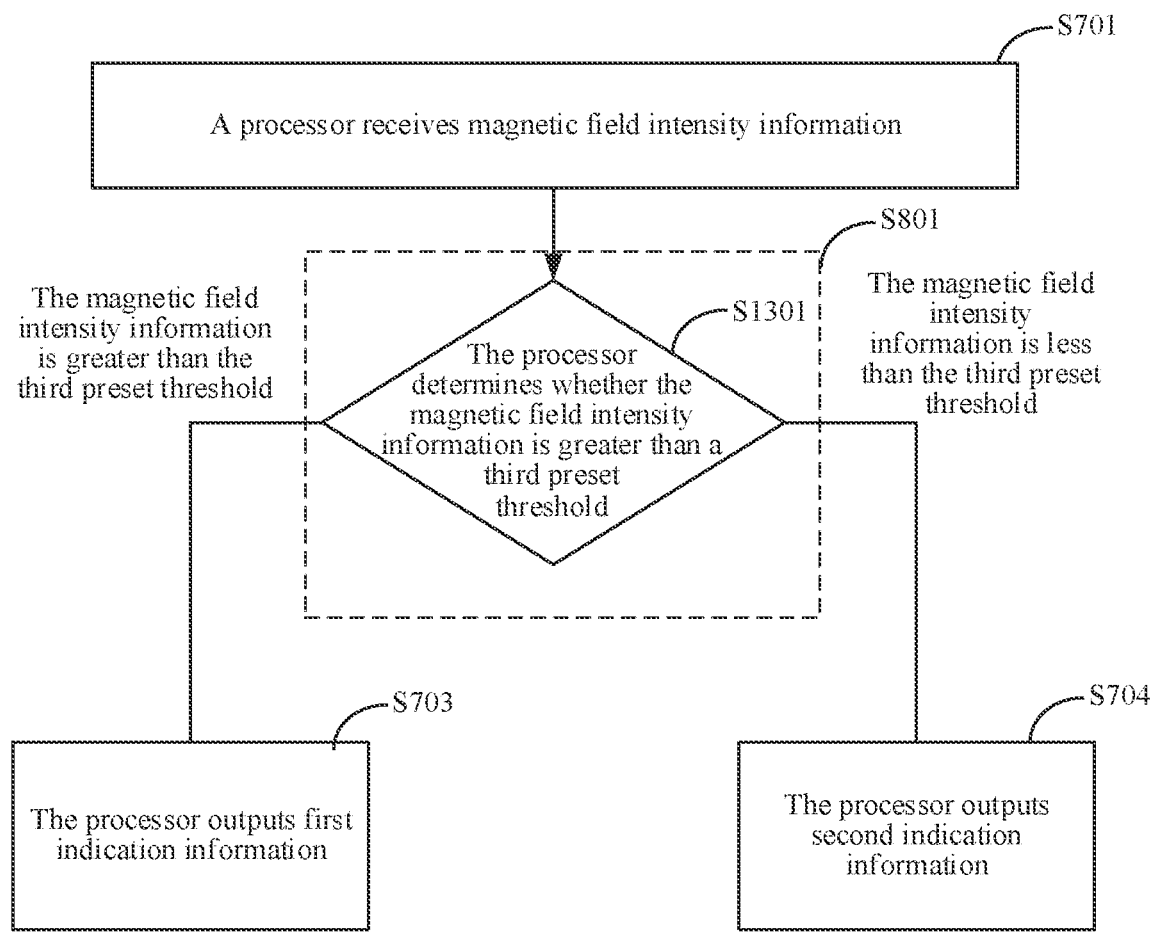
FIG. 13 is a sixth flowchart in which a processor determines an attachment state of a stylus according to an embodiment of this application.

Referring to FIG. 13, FIG. 13 is a sixth flowchart in which a processor determines an attachment state of a stylus according to an embodiment of this application. Different from the embodiment shown in FIG. 8, S801 specifically includes the following.

Step S1301: The processor determines whether the magnetic field intensity information is greater than the third preset threshold: if the magnetic field intensity information is greater than the third preset threshold, step S703 is performed: and if the magnetic field intensity information is less than the third preset threshold, step S704 is performed.

In the specific implementation process, S703 can be performed when the magnetic field intensity information is equal to the third preset threshold.

It should be noted that the second attachment component 210 is offset from the first attachment component 110 by a smaller spacing when the stylus 200 is fixed through attachment to the tablet computer 100, and the distance from the magnetometer 120 is closer, as compared to the state of being fixed in position through attachment. In this case, the first magnetic field intensity information generated by the second attachment component 210 and the first attachment component 110 at the magnetometer 120 is greater than the first magnetic field intensity information as being exactly fixed through attachment. Since the third preset threshold is determined based on the first magnetic field intensity information as being exactly fixed through attachment, the first magnetic field intensity information is greater than the third preset threshold. On this basis, when the stylus 200 is fixed through attachment to the tablet computer 100 in the positive direction or in the negative direction, the processor 150 receives the first magnetic field intensity information that is greater than the third preset threshold, thereby outputting the first indication information to indicate that the stylus 200 is fixed in position through attachment.

Moreover, compared with the state of being fixed in position through attachment, when the stylus 200 is in the unattached state and the misattached state, the spacing by which the second attachment component 210 is offset from the first attachment component 110 is larger, and the distance from the magnetometer 120 is further. In this case, the third magnetic field intensity information and the fourth magnetic field intensity information generated by the second attachment component 210 and the first attachment component 110 at the magnetometer 120 are than the first magnetic field intensity information as being fixed in position through attachment. On this basis, when the stylus 200 is misattached to the tablet computer 100 or is not attached to the tablet computer, the processor 150 receives the third magnetic field intensity information and the fourth magnetic field intensity information less than the third preset threshold, thereby outputting the second indication information to indicate that the to-be-attached accessory is not fixed in position through attachment.

Further, the second attachment component 210 is offset from the first attachment component 110 by a smaller spacing when the stylus 200 is in the exactly misattached state, and the distance from the magnetometer 120 is closer, as compared to the exactly misattached state. In this case, the third magnetic field intensity information generated by the second attachment component 210 and the first attachment component 110 at the magnetometer 120 is greater than the third magnetic field intensity information as being exactly misattached. On this basis, when the stylus 200 is misattached to the tablet computer 100, the processor 150 receives the third magnetic field intensity information that is less than the third preset threshold but greater than the second preset threshold. In this case, the second indication information outputted in S704 shown in FIG. 13 is not only used for indicating that the stylus 200 is not fixed in position through attachment, but also can be used for indicating that the stylus 200 is not fixed in position through attachment.

Moreover, compared with the exactly misattached state, when the stylus 200 is in the unattached state, the spacing by which the second attachment component 210 is offset from the first attachment component 110 is larger, and the distance from the magnetometer 120 is further. In this case, the third magnetic field intensity information generated by the second attachment component 210 and the first attachment component 110 at the magnetometer 120 is less than the second magnetic field intensity information as being exactly misattached. On this basis, when the stylus 200 is not attached to the tablet computer 100, the processor 150 receives the second magnetic field intensity information that is less than the second preset threshold. In this case, the second indication information outputted in S704 shown in FIG. 13 is not only used for indicating that the stylus 200 is not fixed in position through attachment, but also can be used for indicating that the stylus 200 is not attached.

It should be noted that when the preset threshold is the third preset threshold, it is only necessary to ensure that the magnetometer 120 can be covered by the magnetic field of the second attachment component 210 when the spacing by which the second attachment component 210 is offset from the first attachment component 110 is less than or equal to the spacing H0 (that is, the fixed state through attachment). As for another state, whether the magnetometer 120 is covered by the magnetic field of the second attachment component 210 has no effect on the determination of the attachment state of the stylus 200, all of which can be accurately determined and used in a wider range of scenarios.

It should be further noted that an acquisition manner for determining the first magnetic field intensity information of the third preset threshold can refer to the specific implementation of the second magnetic field intensity information in the first case. In this case, the specific implementation of the position of the magnetometer may also result in a specific implementation of the first case. Details are not described herein again.

It should be understood that an objective of detecting the attachment state of the stylus 200 by the tablet computer 100 is to further expand functions of the tablet computer 100. For example, by detecting in real time whether the stylus 200 is attached in position, the user is timely reminded to put the stylus 200 fixed in position through attachment to prevent loss. In some embodiments, an objective of the tablet computer 100 to detect the attachment of the stylus 200 is to charge the stylus. On this basis, the embodiment provides a schematic diagram of an architecture of a system for detecting proper positioning of an accessory shown in FIG. 14.

Figure 14:
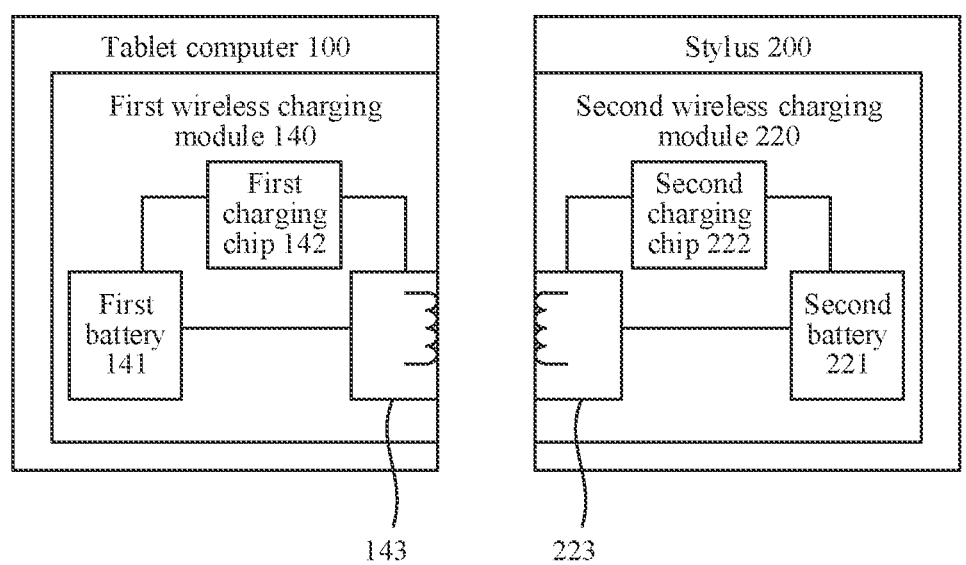
FIG. 14 is a schematic diagram of an architecture of a system for detecting proper positioning of an accessory according to an embodiment of this application.

Referring to FIG. 14, the tablet computer 100 further includes a first wireless charging module 140. The first wireless charging module 140 includes a first battery 141, a first charging chip 142, and a first charging structure 143. The first charging structure 143 is a wireless charging coil. The first charging chip 142 is electrically connected to the first battery 141 and the first charging structure 143, respectively: and the first charging structure 143 is electrically connected to the first battery 141.

The stylus 200 further includes a second wireless charging module 220. The second wireless charging module 220 includes a second battery 221, a second charging chip 222, and a second charging structure 223. The second charging structure 223 is the wireless charging coil. The second charging chip 222 is electrically connected to the second battery 221 and the second charging structure 223, respectively; and the second charging structure 223 is electrically connected to the second battery 221.

The first battery 141 of the tablet computer 100 can be used as a power source to charge the second battery 221. In other embodiments, the first battery 141 may also power another module within the tablet computer 100. The second battery 221 may power another module within the stylus 200.

The first charging chip 142 is configured to control the first charging structure 143 to output a current when the stylus 200 is fixed in position through attachment in a positive direction or in a negative direction. The second charging chip 222 is configured to receive the current through the second charging structure 223 to charge the second battery 221 of the stylus 200 when the stylus 200 is fixed in position through attachment in a positive direction or in a negative direction.

In addition, the first charging structure 143 and the second charging structure 223 can transmit electrical signals to each other to realize information exchange in addition to transferring the current under the control of the first charging chip 142 and the second charging chip 222.

Figure 15:
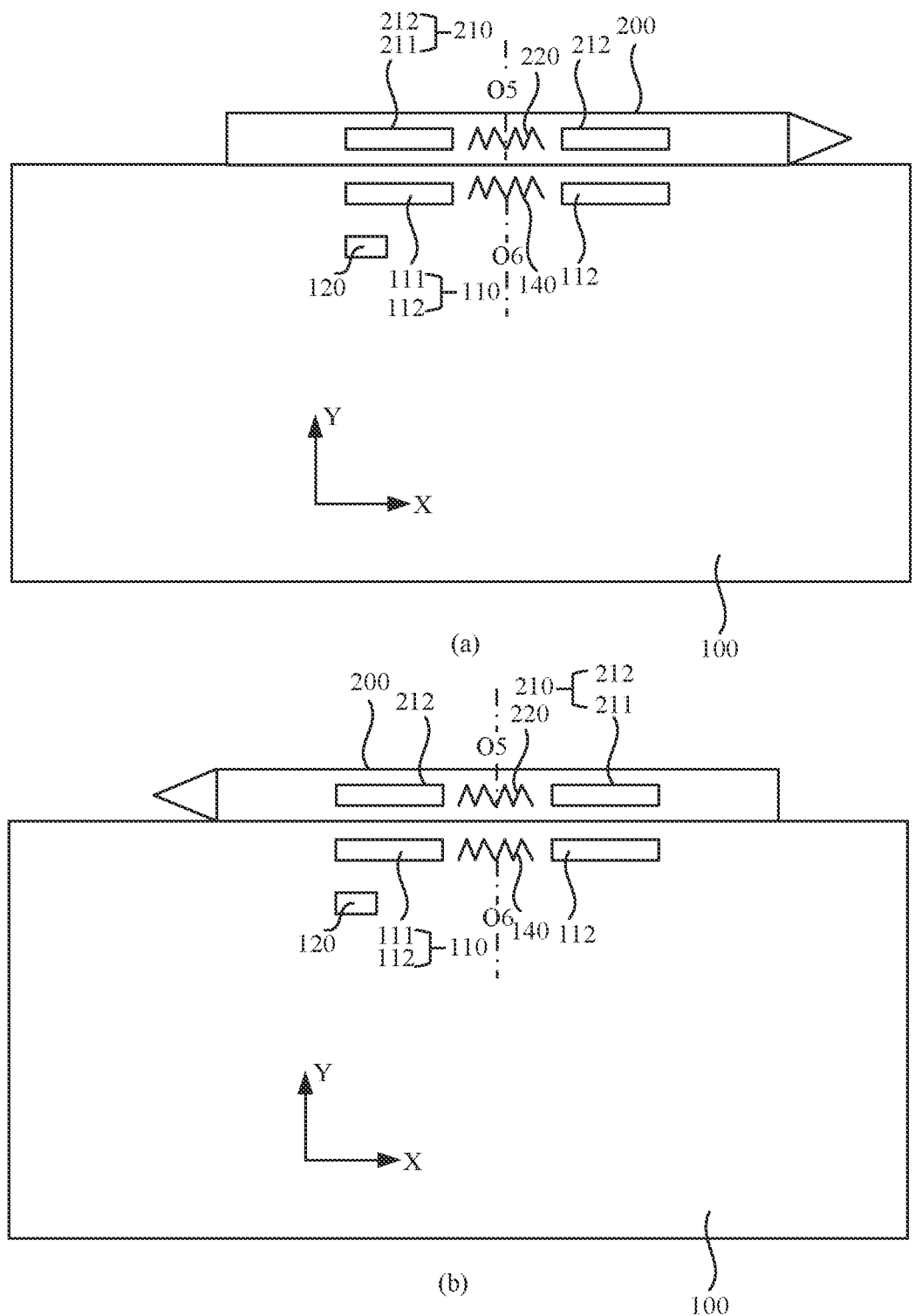
FIG. 15 is another schematic structural diagram of a system for detecting proper positioning of an accessory according to some embodiments of this application.

In order to realize the use of the first charging structure 143 and the second charging structure 223 to realize the charging of the tablet computer 100 to the stylus 200, the embodiment of this application further provides the system for detecting proper positioning of an accessory shown in FIG. 15 based on FIG. 2. The position settings of the first charging structure 143 and the second charging structure 223 are described below with reference to FIG. 15.

Referring to FIG. 15, a first charging structure 143 is arranged on the tablet computer 100. The second charging structure 223 is arranged on the stylus 200. It should be understood that the first charging structure 143 and the second charging structure 223 can only realize signal transmission when the first charging structure is opposite to the second charging structure, so as to realize the charging function. On this basis, the first charging structure 143 and the second charging structure 223 are opposite each other when the stylus 200 is fixed in position through attachment in the positive direction as shown in (a) in FIG. 15, and when the stylus is fixed through attachment in the negative direction as shown in (b) in FIG. 15.

In order to enable the first charging structure 143 to be opposite to the second charging structure 223 whether the stylus 200 fixed through attachment in the positive direction or in the negative direction, the system for detecting proper positioning of an accessory shown in FIG. 15 is provided with the first charging structure 143 and the second charging structure 223 in accordance with the following embodiment.

Still referring to FIG. 15, the first charging structure 143 is symmetrically arranged with respect to a center line of the first attachment component 110. The second charging structure 223 is symmetrically arranged with respect to a center line of the second attachment component 210. It should be understood that for the structure shown in FIG. 15, the center line of the first attachment component 110 is the axis of symmetry of the first attachment member 111 and the second attachment member 112. The center line of the second attachment component 210 is the axis of symmetry of the third attachment member 211 and the fourth attachment member 212. That is to say, in the system for detecting proper positioning of an accessory shown in FIG. 15, the second charging structure 223 is arranged at the center line of the second attachment component 210, and the first charging structure 143 is arranged at the center line of the first attachment component 110. Besides, when the stylus 200 is fixed through attachment to the tablet computer 100 in the positive direction or in the negative direction, the spacing by which the first attachment component 110 is offset from the second attachment component 210 in the direction of the X axis is less than half that of the first charging structure 143 in the direction of the X axis and less than half that of the second charging structure 223 in the direction of the X axis.

It should be understood that in a case that the second charging structure 223 is arranged at the center line of the second attachment component 210 and the first charging structure 143 is arranged at the center line of the first attachment component 110, whether the second charging structure 223 and the first charging structure 143 are opposite when the stylus 200 is fixed through attachment in the positive direction or in the negative direction depends on the maximum spacing H0 at which the first attachment component 110 and the second attachment component 210 are staggered. In this embodiment, the maximum spacing H0 is less than half of the first charging structure 143 in the direction of X axis and less than half of the second charging structure 223 in the direction of X axis. On this basis, the second charging structure 223 located at the center line of the second attachment component 210 is opposed to the first charging structure 143 located at the center line of the first attachment component 110, so that the charging function can be realized by interaction.

It should be noted that the second charging structure 223 is opposed to the first charging structure 143 when the stylus 200 is fixed in position through attachment does not mean that the second charging structure exactly faces (that is, the center line coincides), but refers to the presence of at least a part of overlapping area in the direction of the Y axis. That is to say, the second charging structure 223 can also maintain a relative position relationship when the stylus 200 is fixed in position through attachment and the first charging structure 143 is staggered at a certain spacing from each other. It should be understood that the smaller the spacing by which the second charging structure 223 is offset from the first charging structure 143 when the stylus 200 is fixed in position through attachment, the more efficient the charging. The charging efficiency reaches the highest when the second charging structure 223 exactly faces the first charging structure 143 when the stylus 200 is fixed through attachment. Besides, the spacing by which the second charging structure 223 when the stylus 200 is fixed through attachment is offset from the first charging structure 143 depends on the maximum spacing H0 between the second attachment component 210 and the first attachment component 110 when fixed through attachment. Therefore, in the specific implementation process, the charging efficiency can be used as a reference factor for designing the staggered maximum spacing H0.

In FIG. 14 and FIG. 15, the first charging structure 143 and the second charging structure 223 are wireless charging coils. It should be understood that for the wireless charging coil, the center line refers to the center line along the length direction of the coil. It should be noted that although FIG. 14 and FIG. 15 are illustrated by using the first charging structure 143 and the second charging structure 223 as wireless charging coils, in other embodiments, the second charging structure 223 may also be a conductive post extending radially along the stylus 200 and having an exposed metal contact. Correspondingly, the first charging structure 143 is also a conductive post that extends through the thickness direction of the attachment side edge and has a metal contact exposed on the attachment side edge. The conductive post realizes the current transfer through the metal contact, so as to realize the charging function. It should be understood that, for the conductive post, the center line refers to a center line along a height direction of the conductive post.

It should be understood that in the system for detecting proper positioning of an accessory shown in FIG. 14 and FIG. 15, since the first charging structure 143 and the second charging structure 223 are opposite when the stylus 200 is fixed in position through attachment, the charging function can only be realized through interaction of the first charging structure 143 and the second charging structure 223 when the first charging structure and the second charging structure are opposite. On this basis, before charging, it can be determined whether the stylus 200 is fixed in position through attachment by the following embodiment.

In some embodiments, when the processor 150 outputs the first indication information, it is determined that the stylus 200 is fixed in position through attachment; and when the processor 150 outputs the second indication information, it is determined that the stylus 200 is not fixed in position through attachment.

It should be understood that it may be the processor 150 of the tablet computer 100 that determines the attachment state of the stylus 200. In this case, in order to further turn on the charging function, the processor 150 of the tablet computer 100 needs to send a charging instruction to the first wireless charging module 140 after determining that the stylus 200 is fixed in position through attachment, to inform the stylus 200 to be fixed in position through attachment and to turn on charging. Certainly, the first charging chip 142 may also be configured to determine the attachment state of the stylus 200. In this case, the first charging chip 142 can turn on the charging function after determining that the stylus 200 is fixed in position through attachment. This is not specifically limited in the embodiment of this application.

Figure 16:
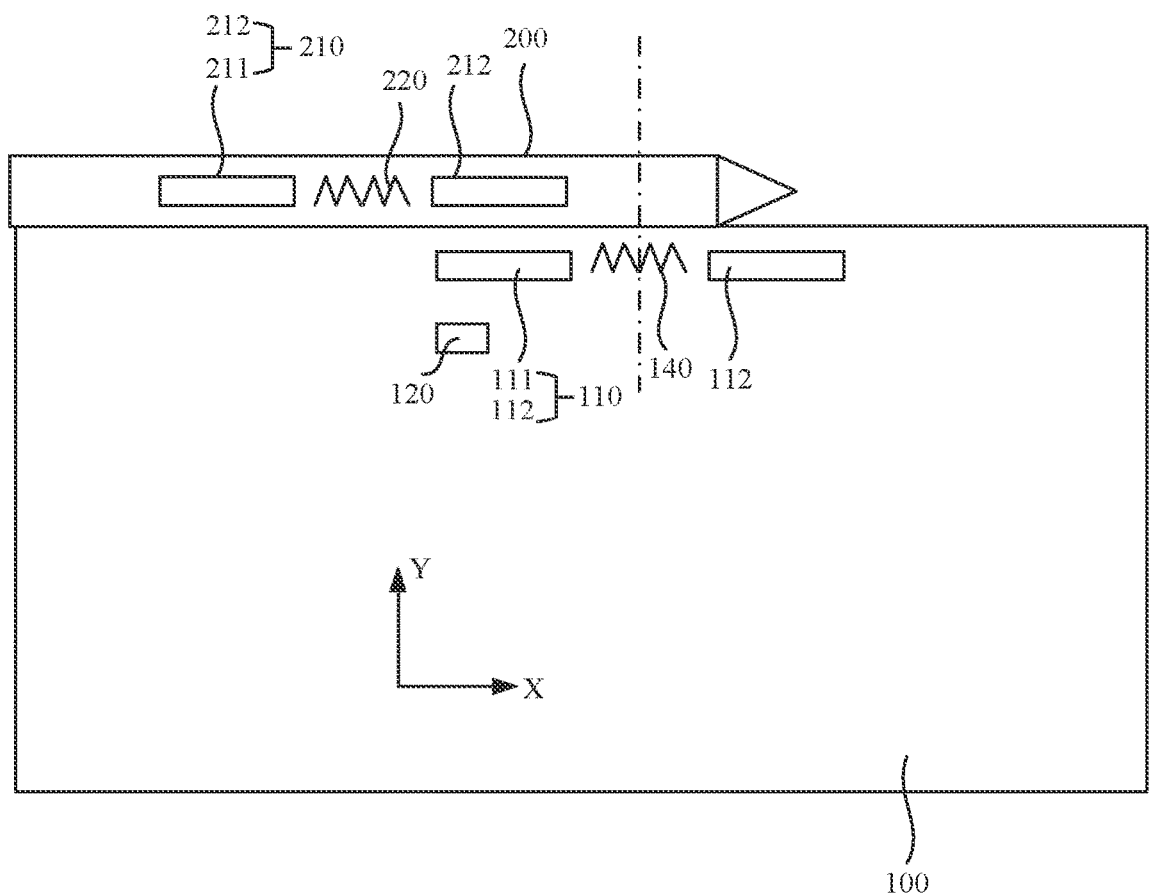
FIG. 16 is a possible placement scenario of the system for detecting proper positioning of an accessory shown in FIG. 15.

Referring to FIG. 16, FIG. 16 is a possible placement scenario of the system for detecting proper positioning of an accessory shown in FIG. 15. As can be seen from FIG. 16, when the stylus 200 is positively placed and the fourth attachment member 212 is opposite to the magnetometer 120, the processor 150 may also be triggered for outputting the first indication information. In this case, the solution of determining the attachment state of the stylus 200 based only on the indication information of the processor 150 may be erroneous determination. Based on this case, an embodiment of this application further provides an embodiment as shown in FIG. 17.

Figure 17:
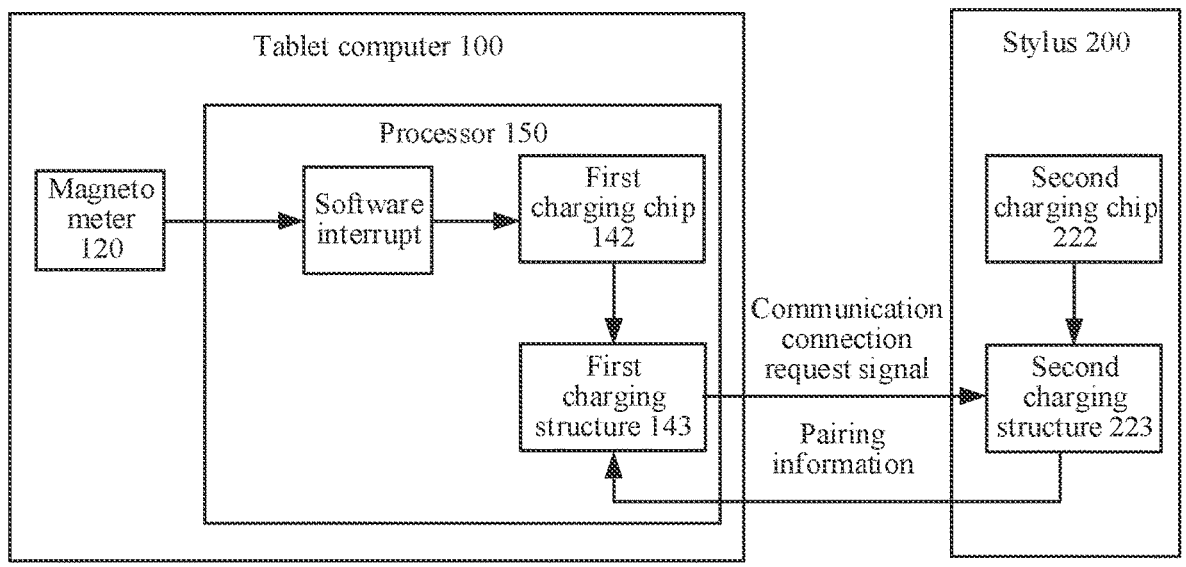
FIG. 17 is a schematic diagram of an architecture of establishing a communication connection between a tablet computer and a stylus in the system for detecting proper positioning of an accessory shown in FIG. 15.

Referring to FIG. 17, FIG. 17 is a schematic diagram of an architecture of establishing a communication connection between a tablet computer 100 and a stylus 200 in the system for detecting proper positioning of an accessory shown in FIG. 15. When the processor 150 triggers a software interrupt and outputs the first indication information, the first charging chip 142 is controlled to output a communication connection request signal through the first charging structure 143. The communication connection request signal is used for causing the stylus 200 to output the pairing information.

The second charging chip 222 receives the communication connection request signal through the second charging structure 223, and parses the communication connection request signal. After the second charging chip 222 parses the received communication connection request signal and determines that it is a communication connection (also referred to as handshake communication), the second charging chip 222 controls the second charging structure 223 to send the pairing information to establish the handshake communication. In other embodiments, a processor 150 may also be arranged within the stylus 200, which is configured to parse the received communication connection request signal and control the second charging chip 222 to send the pairing information through the second charging structure 223 to establish the handshake communication.

The first charging chip 142 receives the pairing information through the first charging structure 143.

Figure 18:
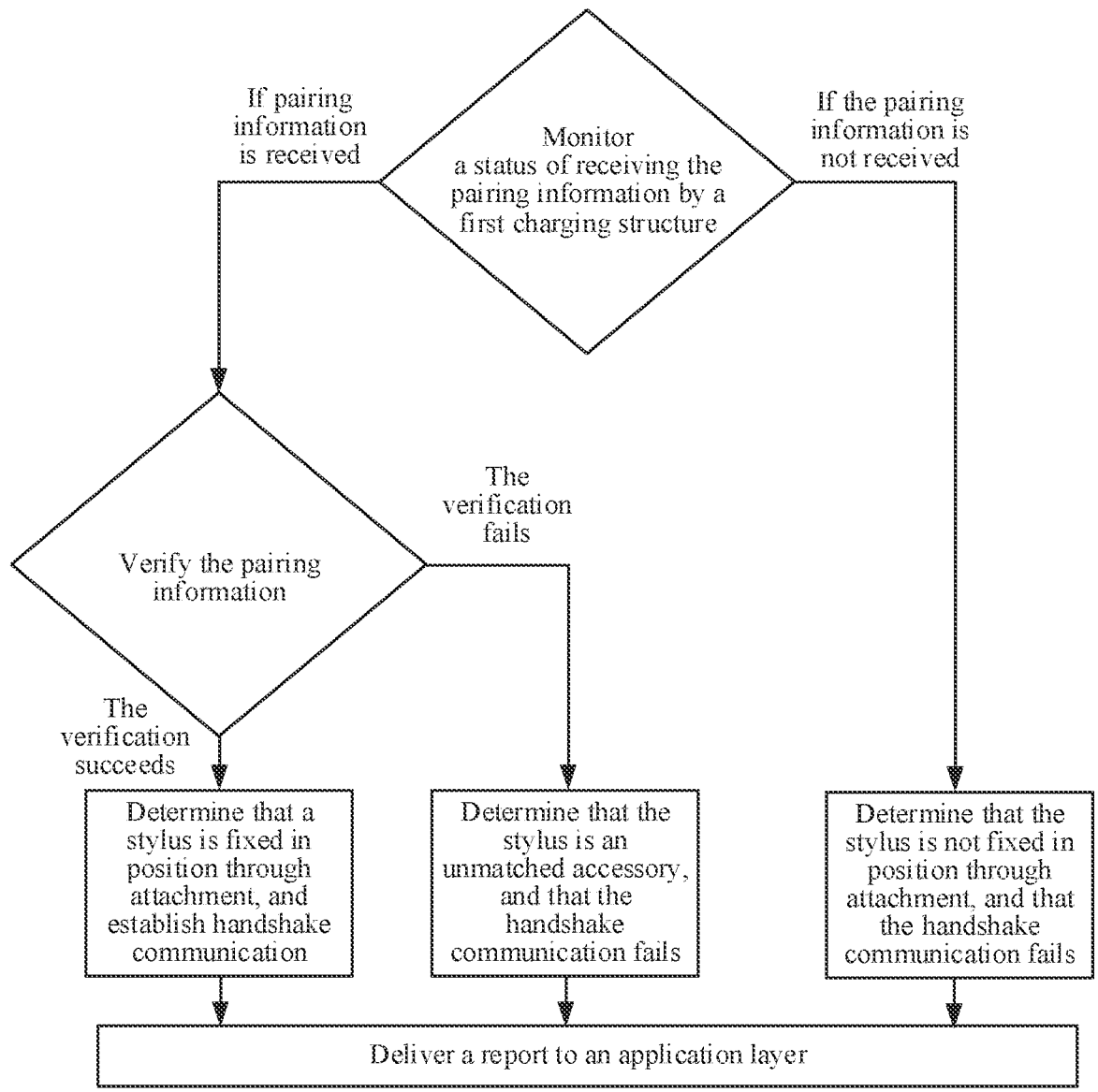
FIG. 18 is a flowchart of the communication connection established a processor in FIG. 17.

Referring to FIG. 18, FIG. 18 is a flowchart of the communication connection established a processor in FIG. 17. It may be understood that, if the stylus 200 is not fixed in position through attachment in the process of establishing the communication connection, the first charging structure 143 and the second charging structure 223 are not opposite. As a result, the second charging structure 223 cannot receive the communication connection request signal sent by the first charging structure 143, and naturally the first charging structure 143 cannot receive the pairing information fed back by the second charging structure 223 based on the communication connection request signal.

If the stylus 200 is fixed in position through attachment, the first charging structure 143 and the second charging structure 223 are opposite. As a result, the second charging structure 223 can receive the communication connection request signal sent by the first charging structure 143, and naturally the first charging structure 143 can also receive the pairing information fed back by the second charging structure 223 based on the communication connection request signal.

On this basis, by monitoring reception of the pairing information by the first charging structure 143, when the first charging structure 143 does not receive the pairing information, the processor 150 determines that the stylus 200 is not fixed in position through attachment currently, and that the handshake communication establishment fails. On this basis, when the first charging structure 143 receives the pairing information, the processor 150 verifies the pairing information. When the pairing information is verified successfully, the processor 150 determines that the stylus 200 is fixed in position through attachment, and that the handshake communication is established successfully; and when the verification of the pairing information fails, the processor 150 determines that the stylus 200 is an unmatched accessory, and that the handshake communication fails to be established.

In some embodiments, when the processor 150 determines that the stylus 200 is fixed in position through attachment, and after the handshake communication is successfully established, the processor 150 may deliver a report to an application layer to prompt the user that the stylus 200 is fixed in position through attachment, and whether the stylus needs to be charged. For example, after the tablet computer 100 and the stylus 200 successfully establish the handshake communication, the processor 150 can output pairing success prompt information to indicate that the stylus 200 is fixed in position through attachment, the handshake communication is successfully established, and the user can also be prompted to select whether to charge. The pairing success prompt information may be pop-up box information or the like. When the user clicks a charging option, the processor 150 sends a charging instruction to the first charging chip 142 to inform the user to start charging. In other embodiments, when the tablet computer 100 and the stylus 200 successfully establish the handshake communication, the processor 150 may also directly send the charging instruction to the first charging chip 142 to inform the user to start charging. However, when the handshake communication fails to be established, the processor 150 determines that the software interrupt is an invalid interrupt signal. At this time, the processor 150 can report the application layer to prompt the user that the stylus 200 is not fixed in position through attachment, or the stylus 200 is an unmatched accessory.

It can be seen that in the implementation shown in FIG. 18, in addition to performing a first-level judgment according to the instruction information, a second-level judgment is also realized by using the communication connection, which effectively solves the accidental trigger scenario shown in FIG. 16.

As can be seen from the above, the first wireless charging module 140 needs to be triggered by the software interrupt before the first wireless charging module operates. On this basis, in order to reduce power consumption, in some embodiments, the first wireless charging module 140 is configured to: switch to the operating state when the processor 150 outputs the software interrupt; and to the low power consumption state when the processor 150 does not output the software interrupt. The operating state here refers to a state in which the first wireless charging module 140 is powered on and the components can operate normally. In the operating state, the first wireless charging module 140 can verify the pairing information, determine the attachment situation of the stylus 200, and the operation of charging.

The low power consumption state here may refer to a state where the first wireless charging module 140 is powered on, but the components are dormant. In the operating state, the low power consumption of each component of the first wireless charging module 140 is very low.

It should be noted that although the process of verifying the pairing information in FIG. 18 and the process of determining the attachment situation of the stylus 200 are performed by the processor 150, in other embodiments, the process may also be performed by the first wireless charging module 140 (specifically, the first charging chip 142). In this case, when it is determined that the stylus 200 is fixed in position through attachment, charging is directly started through the first charging structure 143, which is not specifically limited in the embodiment of this application.

It should be noted that FIG. 15 illustrates the added charging function by using the system for detecting proper positioning of an accessory of the accessories shown in FIG. 2 as an example. In other embodiments, the system for detecting proper positioning of an accessory shown in (a) or (b) in FIG. 3 can also add the charging function. The specific implementation can refer to FIG. 15, which is not be repeated here. It should be understood that when the charging function is added based on the system for detecting proper positioning of an accessory shown in (a) or (b) in FIG. 3, the positions of the center lines of the first attachment component 110 and the second attachment component 210 need to reserve hole positions, to avoid the first charging structure 143 and the second charging structure 223.

Figure 19:
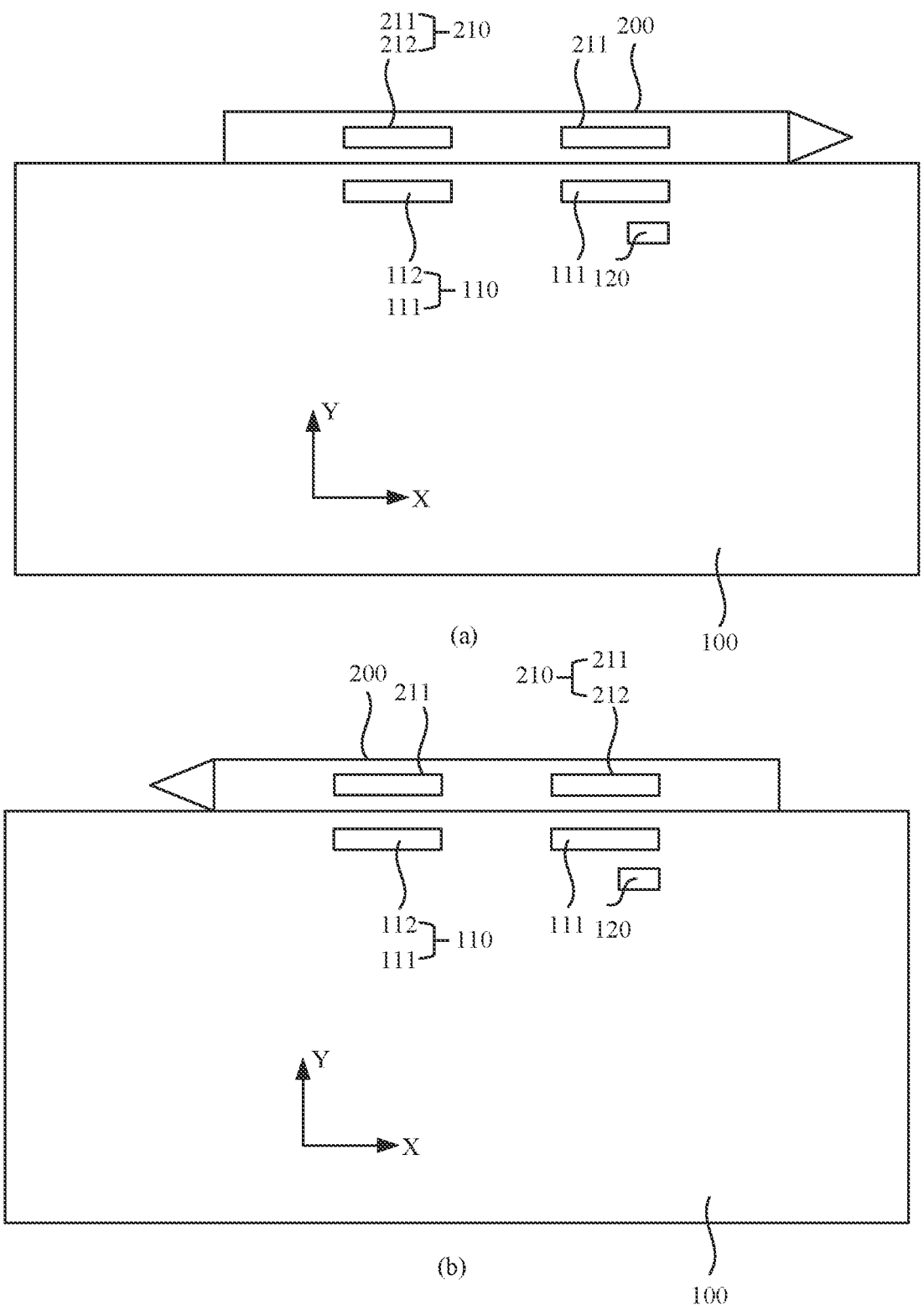
FIG. 19 is a schematic structural diagram of a system for detecting proper positioning of an accessory according to some other embodiments of this application.

In addition, although in FIG. 2 and FIG. 15, the third attachment member 211 and the fourth attachment member 212 are distributed side by side in sequence along the positive direction of the X axis, and the first attachment member 111 and the second attachment member 112 are distributed side by side in sequence along the positive direction of the X axis, in other embodiments, the arrangement order of the third attachment member 211 and the fourth attachment member 212 in the positive direction of the X axis can be exchanged, and the first attachment member 111 and the second attachment member 112 that engage with the third attachment member 211 and the fourth attachment member 212 also need to be exchanged accordingly. In this case, the magnetometer 120 engaged with the first attachment member 111 also needs to be exchanged accordingly. For example, (a) and (b) in FIG. 19 show an example that the second attachment member 112 and the first attachment member 111 distributed side by side in sequence along the positive direction of the X axis, and the fourth attachment member 212 and the third attachment member 211 are sequentially distributed side by side in the positive direction of the X axis based on FIG. 15.

Moreover, although the above embodiments are illustrated through an example that the electronic device 100 is used as the tablet computer 100 and the to-be-attached accessory 200 is used as the stylus 200, it should be understood that in other embodiments, the electronic device 100 and the to-be-attached accessory 200 may also be in other product forms, which are not specifically limited in embodiments of this application. For example, when the electronic device 100 is the tablet computer 100, the to-be-attached accessory 200 may also be an accessory such as a wireless keyboard, a wireless microphone, and a wearable device (such as a watch). For example, the electronic device 100 may also be an electronic whiteboard, and the to-be-attached accessory 200 may be a laser pointer or the like that is engaged with the electronic whiteboard and may be attached to the electronic whiteboard. By detecting whether the electronic device and the to-be-attached accessory is attached in position and then performing the charging operation on the electronic device and the to-be-attached accessory, or only detecting whether the electronic device and the to-be-attached accessory are attached in position to prompt the user to immediately put the electronic device and the to-be-attached accessory back in the fixed position to avoid loss. For example, the electronic device 100 may be a bedside table with the wireless charging function, and the to-be-attached accessory 200 may be a mobile phone or the like that can be charged on a charging plane of the bedside table. The charging operation is performed on the electronic device and the to-be-attached accessory by detecting whether the electronic device and the to-be-attached accessory are attached in position. For example, the electronic device 100 may be a water dispenser having coupled heating through a wireless coil, and the to-be-attached accessory 200 may be a kettle, a water cup, or the like that can be attached to a heating plate of the water dispenser to be heated. By detecting whether the kettle or the water cup is attached in position, a water adding operation is performed on the electronic device and the to-be-attached accessory. It should be understood that for the stylus 200, the first orientation and the second orientation are two orientations that differ by 180 degrees, but when the to-be-attached accessory 200 is a watch, the first orientation and the second orientation may be orientations that differ from other angles (such as 90°). In this case, the third attachment member 211 and the fourth attachment member 212 are not be distributed side by side in one direction, and the first attachment member 111 and the second attachment member 112 are not be distributed side by side in one direction, but have a 90° turning angle. Other contents may be implemented by reference, which are not be described in detail here.

The foregoing content is merely specific implementations of this application, but is not intended to limit the protection scope of this application. Any variation or replacement within the technical scope disclosed in this application shall fall within the protection scope of this application. Therefore, the protection scope of this application shall be subject to the appended claims.

What is claimed is:

1. A system, comprising:
   an accessory, comprising a second attachment component; and
   an electronic device, comprising:
   a first attachment component, wherein the second attachment component is configured to be attached to the first attachment component, so that the accessory is fixed through attachment to the electronic device in a first orientation or a second orientation;
   a magnetometer configured to:
   obtain and output magnetic field intensity information of a position of the magnetometer;
   be triggered by a combined magnetic field of the first attachment component and the second attachment component to output first magnetic field intensity information when the accessory is fixed through attachment to the electronic device in the first orientation or the second orientation; and
   be triggered by a magnetic field of the first attachment component to output second magnetic field intensity information; and
   a processor coupled to the magnetometer, wherein the processor is configured to:
   receive magnetic field intensity information from the magnetometer;

output first indication information when receiving the first magnetic field intensity information that is greater than a first preset threshold, wherein the first preset threshold is based on the second magnetic field intensity information, wherein the first indication information indicates that the accessory is fixed in position through attachment; and output second indication information when the magnetic field intensity information is less than the first preset threshold, wherein the second indication information indicates that the accessory is not fixed in position through attachment.

2. The system of claim 1, wherein the magnetic field intensity information outputted by the magnetometer when the accessory is misattached to the electronic device is third magnetic field intensity information, wherein the processor is configured to:

output the first indication information when the magnetic field intensity information is greater than a second preset threshold, wherein the second preset threshold is based on the third magnetic field intensity information outputted by the magnetometer when the accessory is exactly misattached to the electronic device; and output the second indication information when the magnetic field intensity information is less than the second preset threshold.

3. The system of claim 1, wherein the processor is configured to:

output the first indication information when the magnetic field intensity information is greater than a third preset threshold, wherein the third preset threshold is based on the first magnetic field intensity information outputted by the magnetometer when the accessory is exactly fixed through attachment to the electronic device; and output the second indication information when the magnetic field intensity information is less than the third preset threshold.

4. The system of claim 3, wherein the magnetic field intensity information outputted by the magnetometer when the accessory is misattached to the electronic device is third magnetic field intensity information, wherein the second indication information further indicates that the accessory is misattached when the magnetic field intensity information is less than the third preset threshold and greater than a second preset threshold, wherein the second indication information further indicates that the accessory is not attached when the magnetic field intensity information is less than the second preset threshold, and wherein the second preset threshold is based on the third magnetic field intensity information outputted by the magnetometer when the accessory is exactly misattached to the electronic device.

5. The system of claim 1, wherein the first attachment component comprises a first attachment member and a second attachment member arranged symmetrically and spaced apart, wherein the second attachment component comprises a third attachment member and a fourth attachment member arranged symmetrically and spaced apart, wherein the accessory is fixed through attachment to the electronic device in the first orientation when the first attachment member is attached to the third attachment member and the second attachment member is attached to the fourth attachment member, and wherein the accessory is fixed through attachment to the electronic device in the second orientation when the first attachment member is attached to the fourth attachment member and the second attachment member is attached to the third attachment member.

6. The system of claim 5, wherein the magnetometer is further configured to:

be triggered by a combined magnetic field of the first attachment member and the third attachment member to output the first magnetic field intensity information when the accessory is fixed through attachment to the electronic device in the first orientation; and be triggered by a combined magnetic field of the first attachment member and the fourth attachment member to output the first magnetic field intensity information when the accessory is fixed through attachment to the electronic device in the second orientation.

7. The system of claim 5, wherein the first attachment member and the second attachment member are arranged symmetrically and spaced apart in the first direction, and the first direction is perpendicular to a thickness direction of the electronic device, and wherein the third attachment member and the fourth attachment member are arranged symmetrically and spaced apart in the second direction, and the first orientation is opposite to the second orientation.

8. The system of claim 7, wherein the magnetometer and the first attachment member are arranged spaced apart in a third direction, and the third direction is perpendicular to the first direction and the thickness direction of the electronic device.

9. The system of claim 7, wherein the electronic device further comprises a first wireless charging module, and the first wireless charging module comprises a first charging chip and a first charging structure, wherein the accessory further comprises a second wireless charging module, the second wireless charging module comprises a second charging chip and a second charging structure, and the first charging structure and the second charging structure are opposite when the accessory is fixed through attachment in the first orientation or the second orientation, and wherein the first charging chip is configured to control the first charging structure to output a current when the accessory is fixed in position through attachment, and the second charging chip is configured to receive the current through the second charging structure to charge the accessory when the accessory is fixed in position through attachment.

10. The system of claim 9, wherein the first charging structure is symmetrically arranged with respect to a center line of the first attachment component, and wherein the second charging structure is symmetrically arranged with respect to a center line of the second attachment component, and a spacing by which the first attachment component is offset from the second attachment component in the second direction is less than half of a dimension of the first charging structure in the first direction and less than half of a dimension of the second charging structure in the second direction when the accessory is fixed through attachment to the electronic device.

11. The system of claim 9, wherein the first charging chip is further configured to control the first charging structure to output a communication connection request signal before the processor determines that the accessory is fixed in position through attachment or the accessory is not fixed in position through attachment, and the communication connection request signal enables the accessory to output pairing information, wherein the first charging chip is further configured to receive the pairing information through the first charging structure, wherein the first charging structure receiving the pairing information and the pairing information being successfully verified indicates that the accessory is fixed in position through attachment, wherein the first charging structure not receiving the pairing information indicates that the accessory is not fixed in position through attachment, and wherein the second charging chip is further configured to receive the communication connection request signal through the second charging structure, and control the second charging structure to output the pairing information after receiving the communication connection request signal.

12. The system of claim 9, wherein the first wireless charging module is further configured to switch to an operating state when the electronic device receives the first indication information, and wherein the first wireless charging module is further configured to switch to a low power consumption state when the electronic device does not receive the first indication information.

13. The system of claim 7, wherein the accessory is a stylus, the stylus is attached to a side edge or a back side of the electronic device in the first orientation or the second orientation, and the second direction is a length direction of the stylus.

14. An electronic device, comprising:
a first attachment component configured to be attached to a second attachment component of an accessory to fix the accessory to the electronic device in a first orientation or a second orientation;
a magnetometer configured to:
obtain and output magnetic field intensity information of a position of the magnetometer;
be triggered by a combined magnetic field of the first attachment component and the second attachment component to output first magnetic field intensity information when the accessory is fixed to the electronic device in the first orientation or the second orientation; and
be triggered by a magnetic field of the first attachment component to output second magnetic field intensity information; and
a processor coupled to the magnetometer, wherein the processor is configured to:
receive magnetic field intensity information from the magnetometer;
output first indication information when receiving the first magnetic field intensity information that is greater than a first preset threshold, wherein the first preset threshold is based on the second magnetic field intensity information, wherein the first indication information indicates that the accessory is fixed in position through attachment; and
output second indication information when the magnetic field intensity information is less than the first preset threshold, wherein the second indication information indicates that the accessory is not fixed in position through attachment.

15. The electronic device of claim 14, wherein the processor is configured to:
output the first indication information when the magnetic field intensity information is greater than a third preset threshold, wherein the third preset threshold is based on the first magnetic field intensity information outputted by the magnetometer when the accessory is exactly fixed through attachment to the electronic device; and
output the second indication information when the magnetic field intensity information is less than the third preset threshold.

16. The electronic device of claim 15, wherein the magnetic field intensity information outputted by the magnetometer when the accessory is misattached to the electronic device is third magnetic field intensity information, wherein the second indication information further indicates that the accessory is misattached when the magnetic field intensity information is less than the third preset threshold and greater than a second preset threshold, wherein the second indication information further indicates that the accessory is not attached when the magnetic field intensity information is less than the second preset threshold, and wherein the second preset threshold is based on the third magnetic field intensity information outputted by the magnetometer when the accessory is exactly misattached to the electronic device.

17. The electronic device of claim 14, wherein the first attachment component comprises a first attachment member and a second attachment member arranged symmetrically and spaced apart, wherein the second attachment component comprises a third attachment member and a fourth attachment member arranged symmetrically and spaced apart, wherein the accessory is fixed through attachment to the electronic device in the first orientation when the first attachment member is attached to the third attachment member and the second attachment member is attached to the fourth attachment member, and wherein the accessory is fixed through attachment to the electronic device in the second orientation when the first attachment member is attached to the fourth attachment member and the second attachment member is attached to the third attachment member.

18. The electronic device of claim 17, wherein the magnetometer is further configured to:
be triggered by a combined magnetic field of the first attachment member and the third attachment member to output the first magnetic field intensity information when the accessory is fixed through attachment to the electronic device in the first orientation; and
be triggered by a combined magnetic field of the first attachment member and the fourth attachment member to output the first magnetic field intensity information when the accessory is fixed through attachment to the electronic device in the second orientation.

19. The electronic device of claim 17, wherein the first attachment member and the second attachment member are arranged symmetrically and spaced apart in the first direction, and the first direction is perpendicular to a thickness direction of the electronic device, and wherein the third attachment member and the fourth attachment member are arranged symmetrically and spaced apart in the second direction, and the first orientation is opposite to the second orientation.

20. An electronic device, comprising:
a first attachment component configured to be attached to a second attachment component of an accessory to fix the accessory to the electronic device in a first orientation or a second orientation;
a magnetometer configured to:
obtain and output magnetic field intensity information of a position of the magnetometer;
be triggered by a combined magnetic field of the first attachment component and the second attachment component to output first magnetic field intensity information when the accessory is fixed to the electronic device in the first orientation or the second orientation; and
be triggered by a magnetic field when the accessory is misattached to the electronic device to output third magnetic field intensity information; and
a processor coupled to the magnetometer, wherein the processor is configured to:

receive magnetic field intensity information from the magnetometer;

output first indication information when the magnetic field intensity information is greater than a second preset threshold, wherein the second preset threshold is based on the third magnetic field intensity information outputted by the magnetometer when the accessory is exactly misattached to the electronic device, wherein the first indication information indicates that the accessory is fixed in position through attachment; and output second indication information when the magnetic field intensity information is less than the second preset threshold, wherein the second indication information indicates that the accessory is not fixed in position through attachment.

* * * * *